US009456489B2

(12) United States Patent
Kikuchi

(10) Patent No.: US 9,456,489 B2
(45) Date of Patent: Sep. 27, 2016

(54) PRINTED CIRCUIT BOARD AND PRINTED WIRING BOARD

(71) Applicant: CANON KABUSHIKI KAISHA, Tokyo (JP)

(72) Inventor: Masanori Kikuchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 137 days.

(21) Appl. No.: 14/174,787

(22) Filed: Feb. 6, 2014

(65) Prior Publication Data

US 2014/0226278 A1     Aug. 14, 2014

(30) Foreign Application Priority Data

Feb. 13, 2013   (JP) ................. 2013-025454

(51) Int. Cl.
*H05K 1/02*       (2006.01)
*G11C 29/02*      (2006.01)
*H05K 1/11*       (2006.01)

(52) U.S. Cl.
CPC .......... *H05K 1/0246* (2013.01); *G11C 29/023* (2013.01); *G11C 29/025* (2013.01); *H05K 1/0243* (2013.01); *H05K 1/114* (2013.01); *H05K 2201/10159* (2013.01)

(58) Field of Classification Search
None
See application file for complete search history.

(56) References Cited

U.S. PATENT DOCUMENTS 5,394,121 A * 2/1995 Cipolla ................ G11C 7/1048
                                                333/124
5,521,431 A * 5/1996 Tahara .................. H01L 23/495
                                                257/666

(Continued)

FOREIGN PATENT DOCUMENTS

JP         2009-086841 A       4/2009

*Primary Examiner* — Xanthia C Cunningham
(74) *Attorney, Agent, or Firm* — Fitzpatrick, Cella, Harper & Scinto

(57) ABSTRACT

A memory system is provided with a motherboard, and a memory controller and a plurality memory devices mounted on the motherboard. The motherboard comprises a unicursal-shape main wiring, and branch wirings branched from the main wiring to the respective memory devices. Further, the motherboard comprises an open stub wiring branched from a connecting point between a start end and a branch point of the main wiring. Thus, a ringing of a waveform of a signal received by a receiving circuit can be suppressed irrespective of a wiring length of the branch wiring.

12 Claims, 14 Drawing Sheets

(56) References Cited

U.S. PATENT DOCUMENTS

| | | | | |
|---|---|---|---|---|
| 5,680,060 A * | 10/1997 | Banniza | ............... | H03H 11/28 326/30 |
| 6,249,013 B1 * | 6/2001 | Hirose | ............... | H01P 1/15 257/208 |
| 6,384,476 B2 * | 5/2002 | Takeuchi | ............... | H01L 23/642 257/691 |
| 6,438,012 B1 * | 8/2002 | Osaka | ............... | G11C 5/063 365/230.03 |
| 6,978,328 B1 * | 12/2005 | Osaka | ............... | H05K 1/0228 365/52 |
| 7,389,381 B1 * | 6/2008 | Co | ............... | G06F 13/1673 711/115 |
| 7,408,423 B2 * | 8/2008 | Asano | ............... | H01L 23/66 333/12 |
| 7,692,300 B2 | 4/2010 | Kikuchi | | |
| 8,134,239 B2 * | 3/2012 | Hiraishi | ............... | G11C 5/04 257/784 |
| 8,260,979 B2 * | 9/2012 | Ware | ............... | G06F 13/3625 365/189.04 |
| 8,681,546 B2 * | 3/2014 | Fai | ............... | G11C 8/10 366/185.05 |
| 8,922,029 B2 * | 12/2014 | Hiraishi | ............... | G11C 5/04 257/784 |
| 9,082,464 B2 * | 7/2015 | Sung | ............... | G11C 5/04 |
| 2001/0035769 A1 * | 11/2001 | Takekuma | ............... | G06F 13/4072 326/30 |
| 2003/0037216 A1 * | 2/2003 | Shibata | ............... | G11C 5/147 711/200 |
| 2003/0052712 A1 * | 3/2003 | Comer | ............... | H01L 23/5252 326/38 |
| 2003/0161196 A1 * | 8/2003 | Park | ............... | G06F 13/4086 365/200 |
| 2004/0054845 A1 * | 3/2004 | Ware | ............... | G06F 13/1684 711/100 |
| 2004/0105292 A1 * | 6/2004 | Matsui | ............... | G06F 13/4243 365/63 |
| 2004/0196682 A1 * | 10/2004 | Funaba | ............... | H01L 23/552 365/149 |
| 2004/0251929 A1 * | 12/2004 | Pax | ............... | G11C 5/025 326/30 |
| 2005/0105318 A1 * | 5/2005 | Funaba | ............... | G11C 5/063 365/63 |
| 2005/0230823 A1 * | 10/2005 | Ohsaka | ............... | H05K 1/0243 257/735 |
| 2006/0023482 A1 * | 2/2006 | Dreps | ............... | G11C 5/04 365/63 |
| 2006/0066416 A1 * | 3/2006 | Nicholson | ............... | H01L 23/04 333/32 |
| 2006/0139131 A1 * | 6/2006 | Asano | ............... | H01L 23/66 333/263 |
| 2007/0189049 A1 * | 8/2007 | Djordjevic | ............... | G11C 5/06 365/51 |
| 2007/0194968 A1 * | 8/2007 | Sung | ............... | G11C 5/04 341/154 |
| 2007/0255983 A1 * | 11/2007 | Funaba | ............... | G11C 5/04 714/724 |
| 2009/0086522 A1 * | 4/2009 | Hiraishi | ............... | G11C 5/04 365/63 |
| 2009/0237166 A1 * | 9/2009 | Gotou | ............... | H01L 23/66 330/295 |
| 2010/0117711 A1 * | 5/2010 | Suzuki | ............... | H01L 23/66 327/356 |
| 2010/0177492 A1 * | 7/2010 | Park | ............... | H05K 1/0246 361/782 |
| 2010/0201397 A1 * | 8/2010 | Gillingham | ............... | H03K 19/0005 326/30 |
| 2010/0202227 A1 * | 8/2010 | Nguyen | ............... | G11C 5/063 365/198 |
| 2010/0312956 A1 * | 12/2010 | Hiraishi | ............... | G11C 5/04 711/105 |
| 2012/0250264 A1 * | 10/2012 | Osanai | ............... | G11C 5/04 361/728 |
| 2013/0138898 A1 * | 5/2013 | Osanai | ............... | G06F 12/00 711/154 |

* cited by examiner

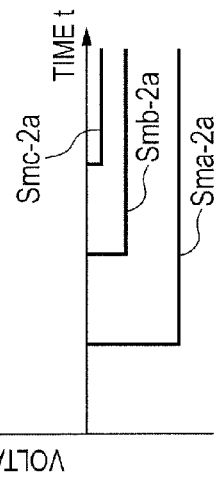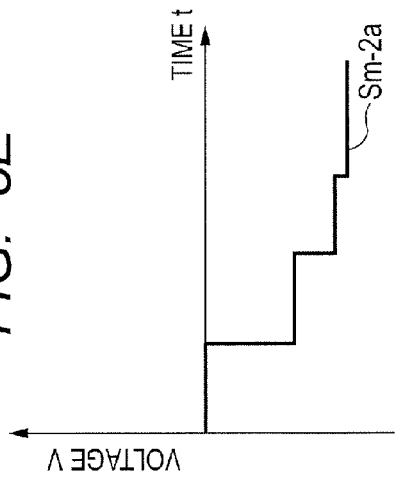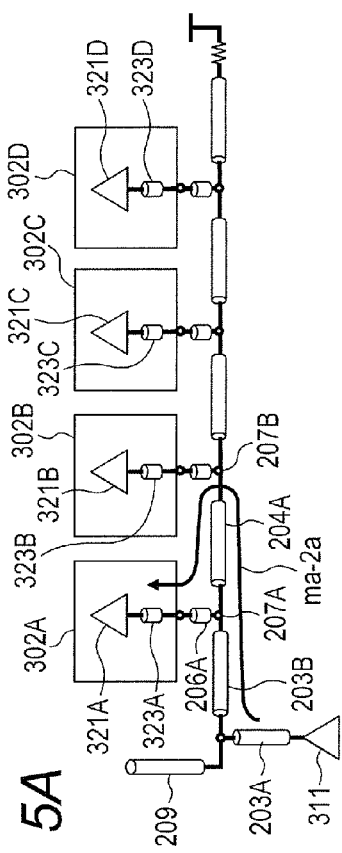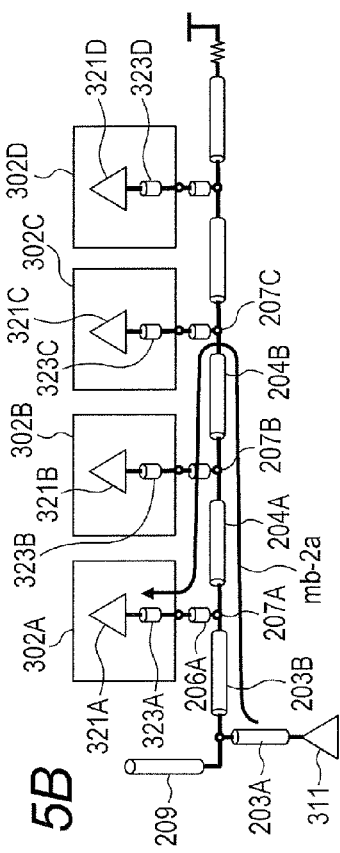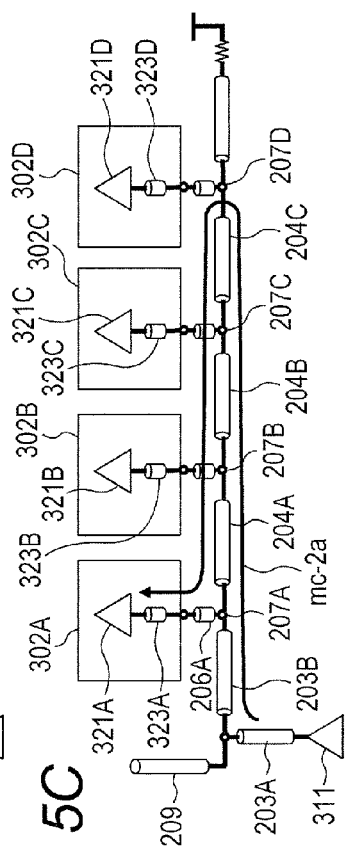

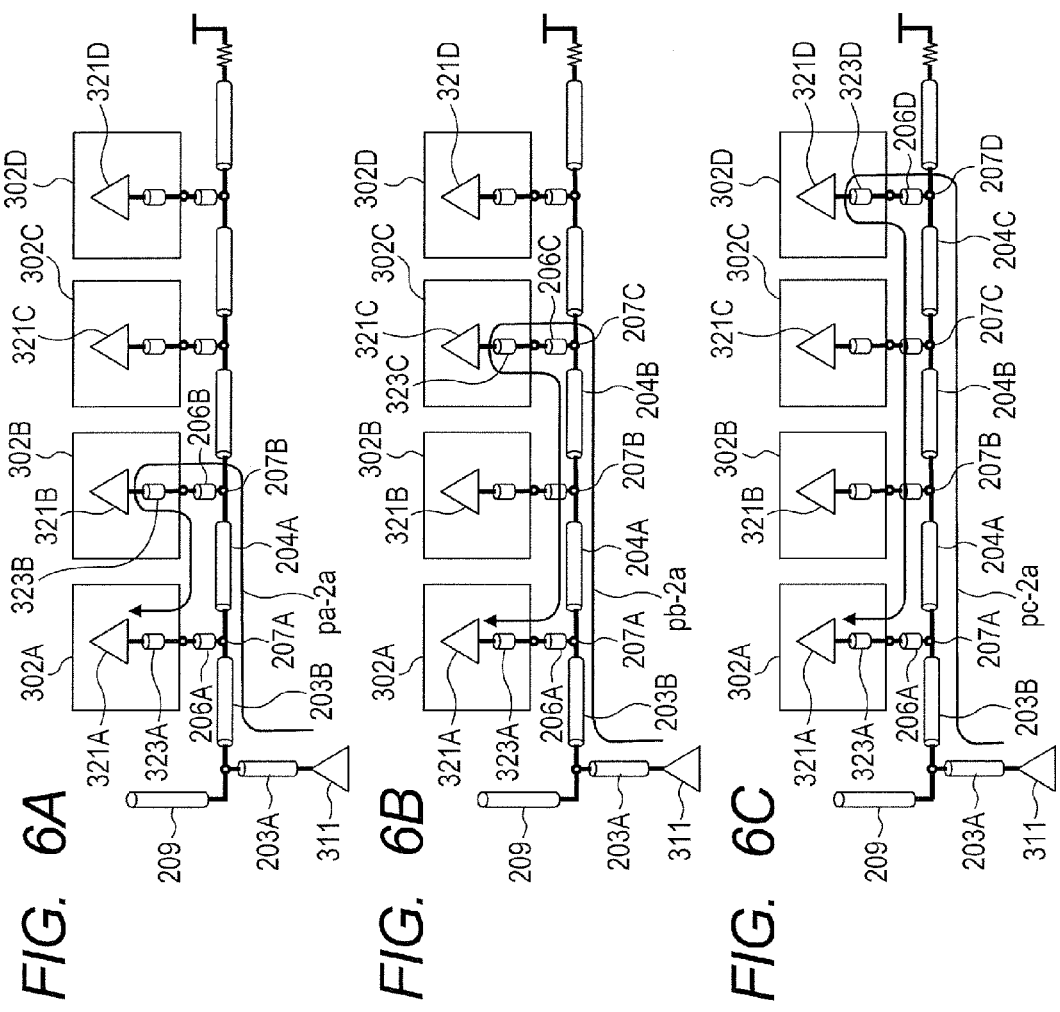

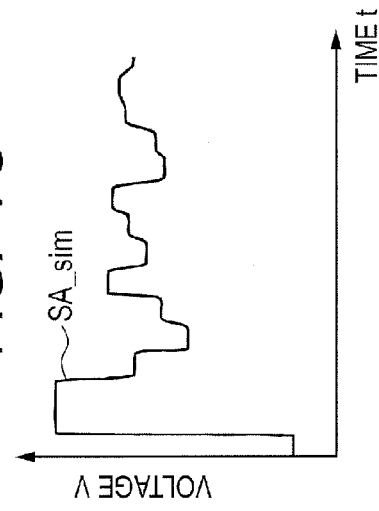
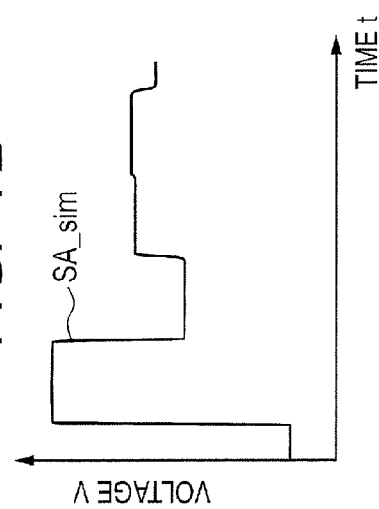
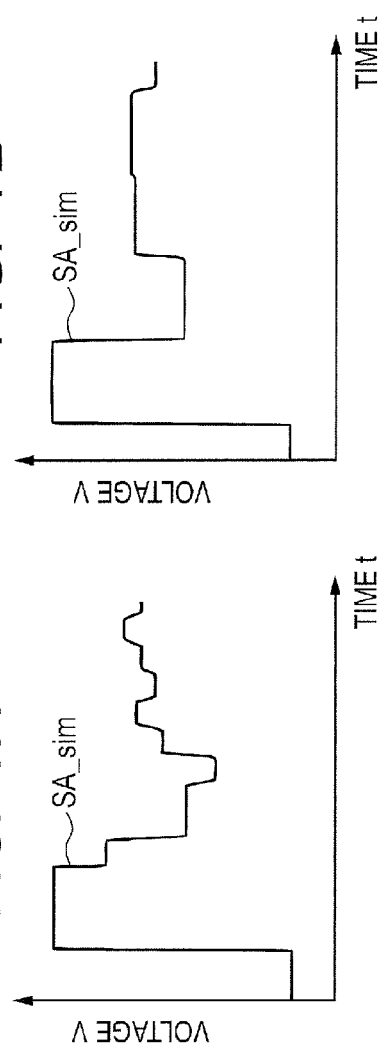
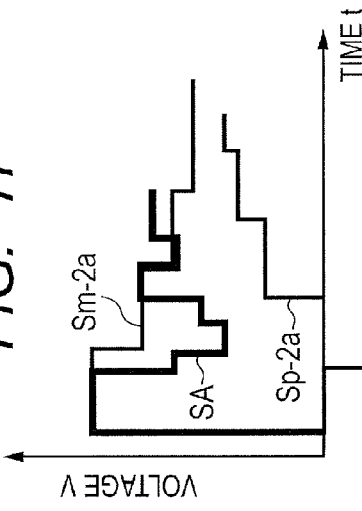
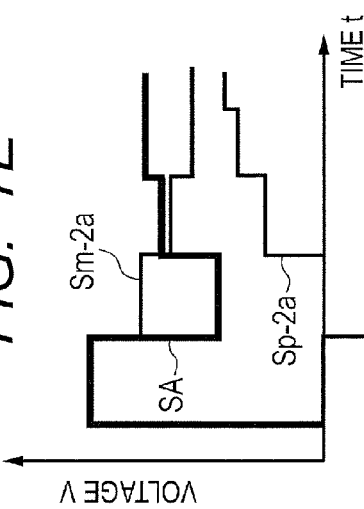
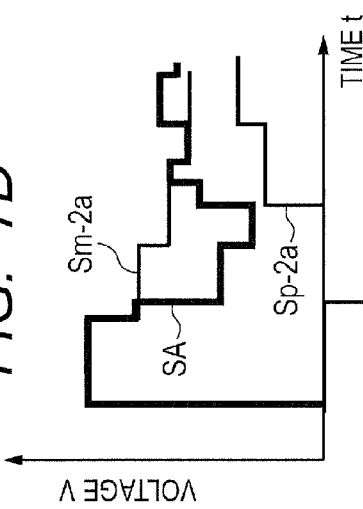

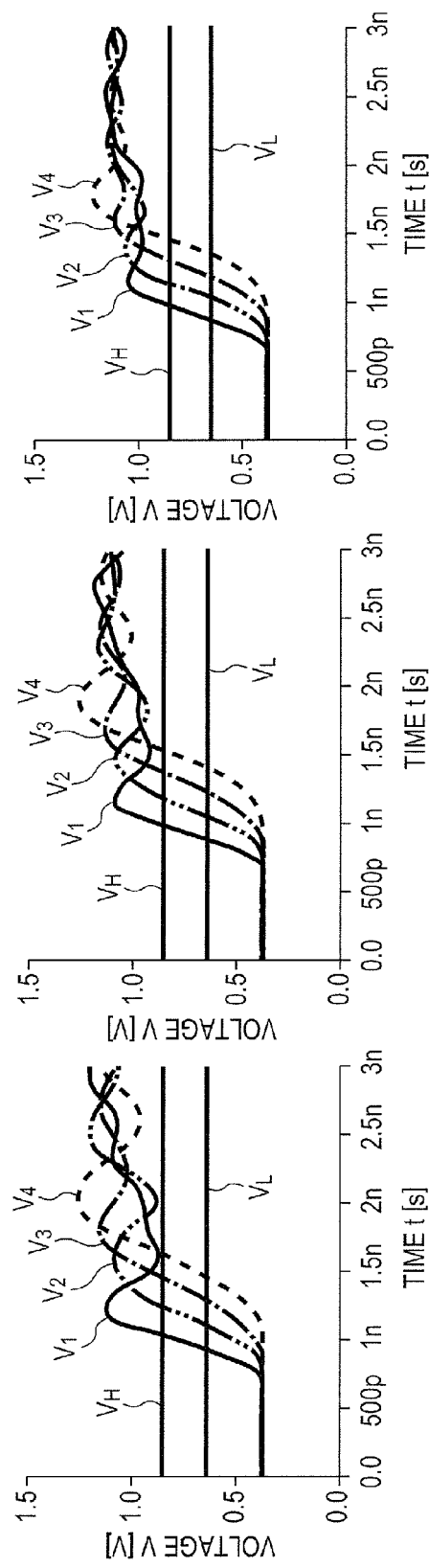

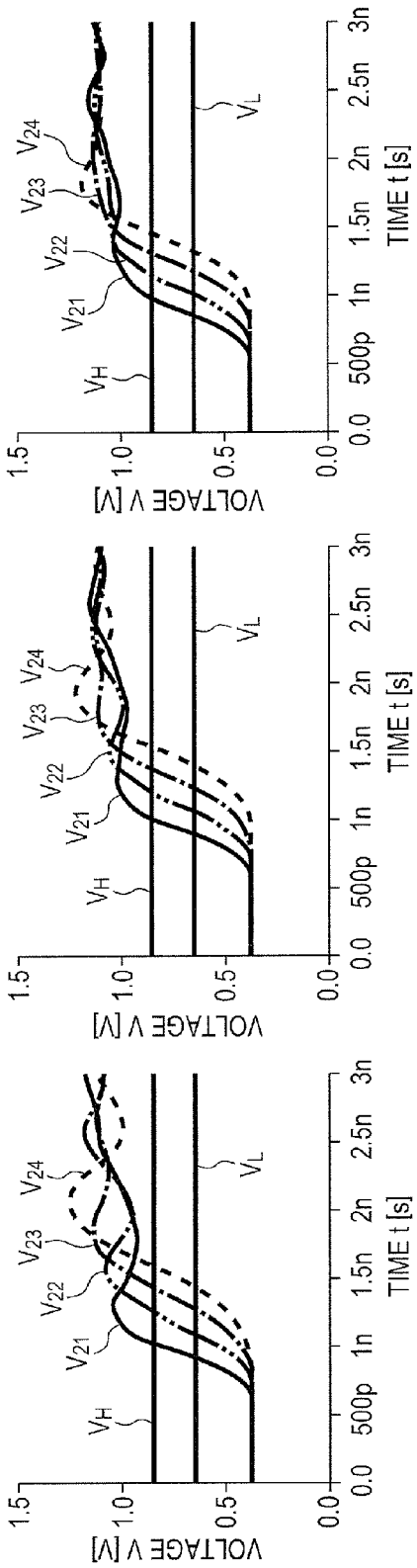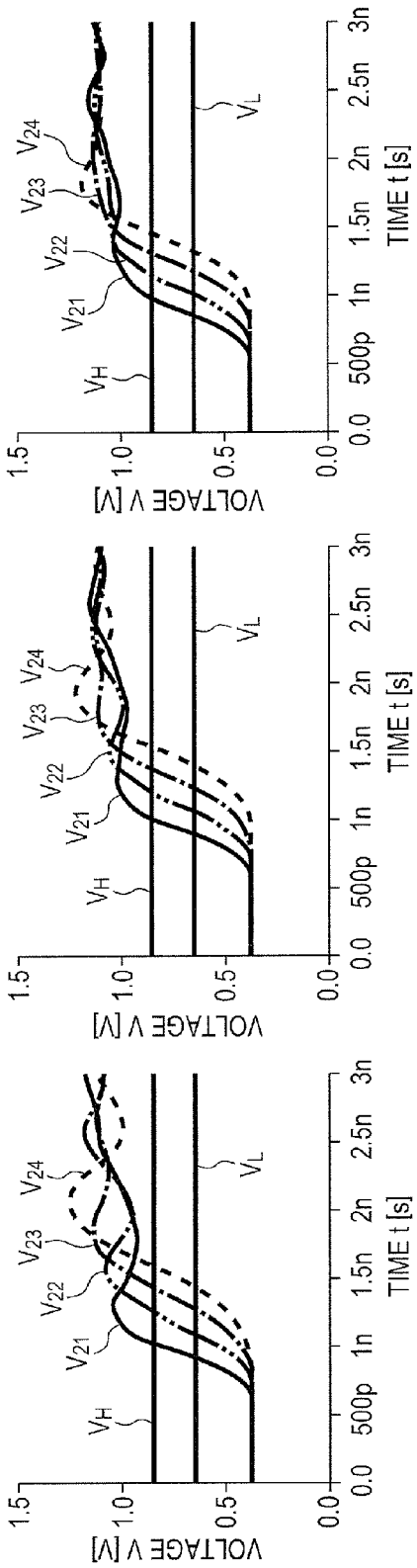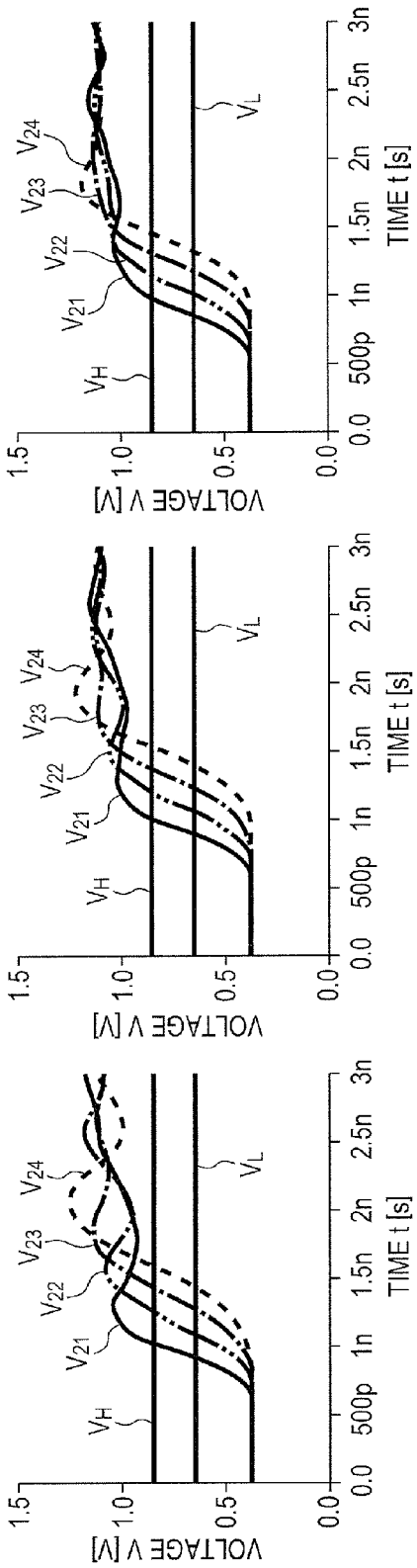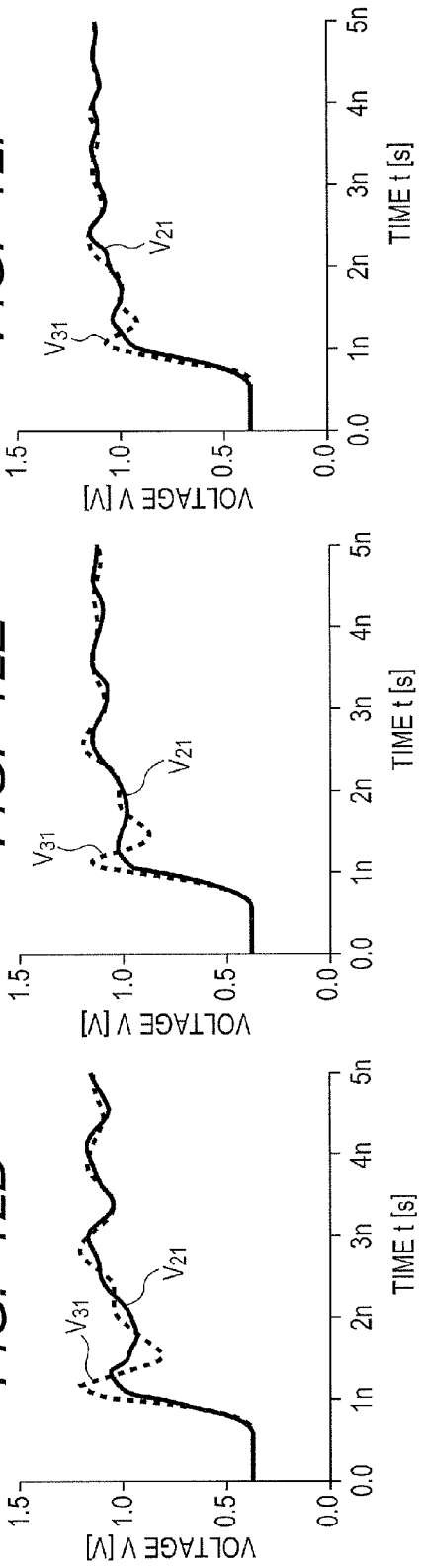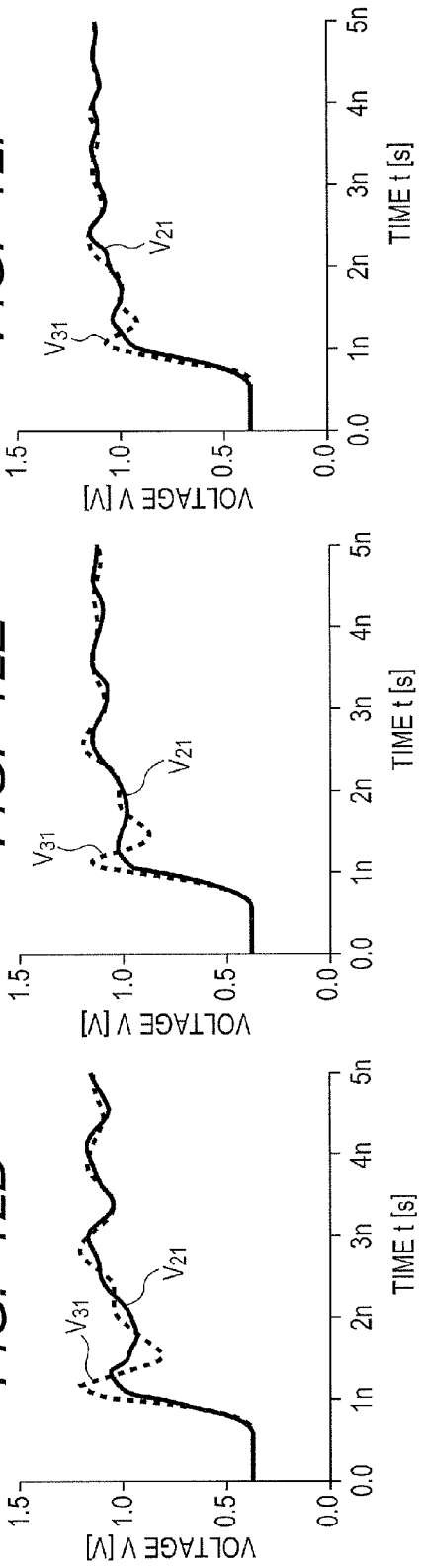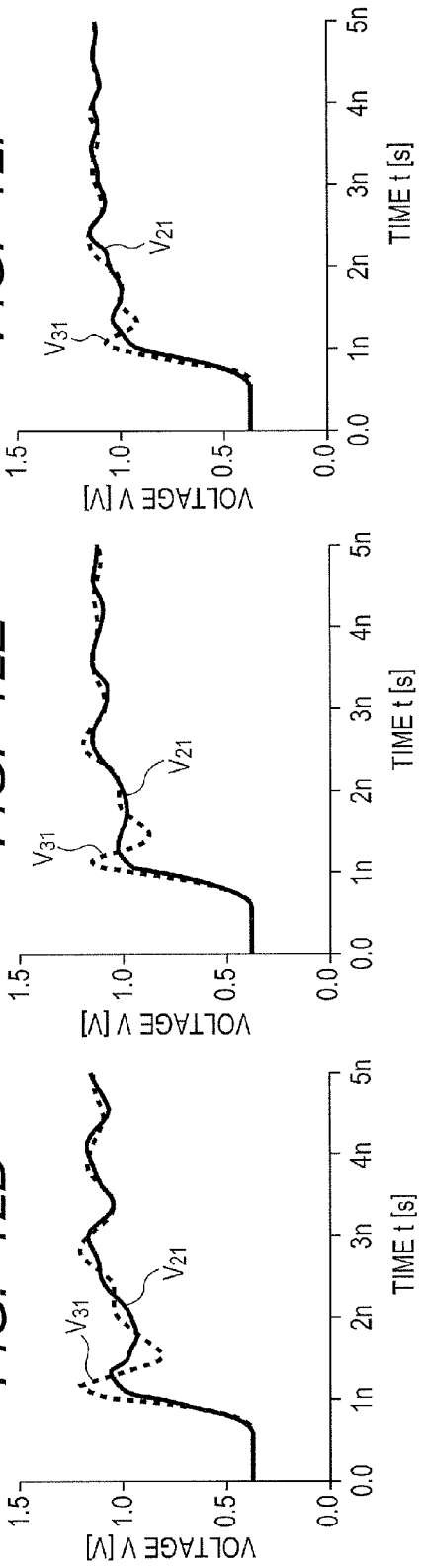

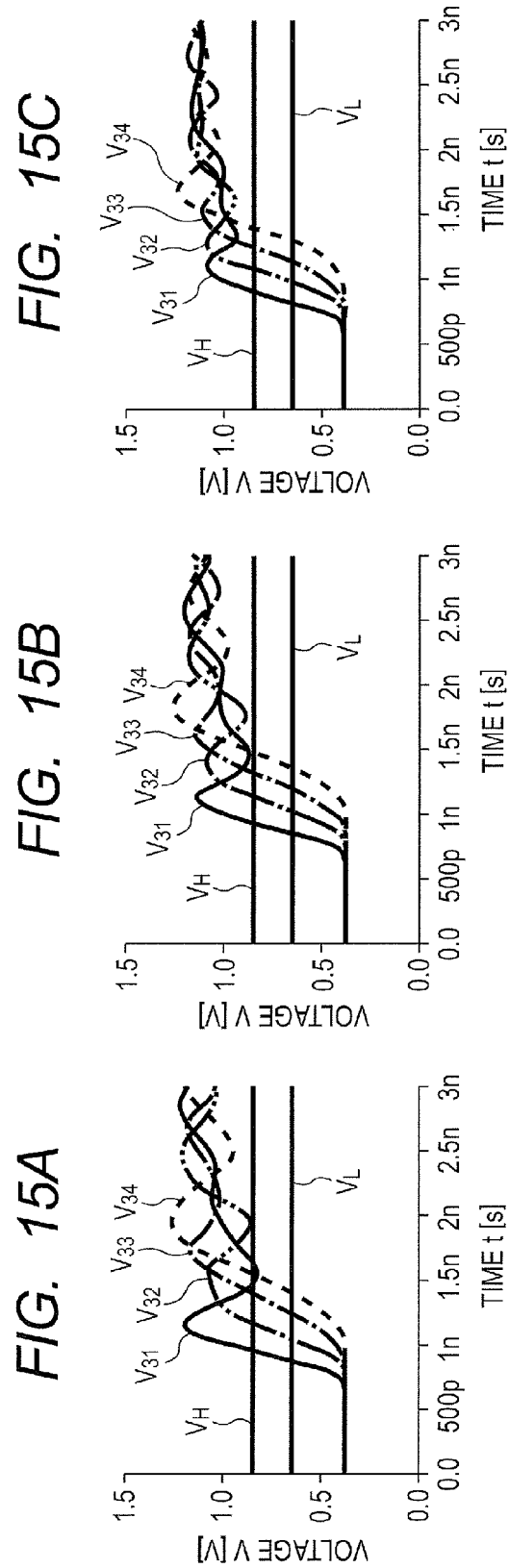

PRINTED CIRCUIT BOARD AND PRINTED WIRING BOARD

BACKGROUND OF THE INVENTION

1. Field of the Invention

The present invention relates to a printed circuit board and a printed wiring board each of which has a constitution that receiving circuits are electrically connected to a main wiring through respective branch wirings.

2. Description of the Related Art

Generally, a memory system has been constituted so as to have a memory controller and a plurality of memory devices. Here, "DDR3-SDRAM" (Double Data Rate 3-Synchronous Dynamic Random Access Memory) has been generally known as the memory device.

Incidentally, there are two mounting configurations of the memory devices, i.e., one configuration in which the memory devices are mounted on a motherboard, and the other configuration in which the memory devices are mounted on a module substrate. In the configuration in which the memory devices are mounted on the module substrate, the module substrate having the mounted memory devices thereon is connected through a connector to a motherboard on which a memory controller has been mounted, thereby constituting a memory system.

The memory controller transmits an address signal or a command signal (or an address/command signal), and each of the memory devices, which receives the address/command signal, is controlled based on the received signal, so that data signals are transmitted and received between the memory controller and the plurality of memory devices. Under such a condition, particularly in a high-functional electronic device, the plurality of DDR3-SDRAMs are often mounted and used as the memory devices to secure a sufficient memory capacity.

Each of the memory devices, which is realized by the DDR3-SDRAM, has a built-in function for adjusting signal transmission timing. The respective memory devices are connected to a universal-shape main wiring which is called a fly-by-wire and enables high-speed transmission of the address/command signal.

Incidentally, in the JEDEC standard (No. 21C PC3-6400/PC3-8500/PC3-10600/PC3-12800 DDR3 Unbuffered SO-DIMM Reference Design Specification), the inner two layers in a printed wiring board are used as the main wiring. Moreover, a BGA (Ball Grid Array) semiconductor package is used as the memory device. On the printed wiring board, a via hole formed on the main wiring, a mounting pad connected to the receiving terminal of the BGA semiconductor package, and an extraction wiring for connecting the via hole and the mounting pad to each other are formed so as to together constitute the branch wiring for branching from the main wiring to the memory device. Further, when the small-diameter via hole capable of being arranged between the mounting pads is used as a part of the branch wiring, the branch wiring to the memory device can be shortened.

On the other hand, in Japanese Patent Application Laid-Open No. 2009-86841, it has been proposed, in a DIMM (Dual Inline Memory Module) having a DDR3-SDRAM mounted on a module substrate, to reduce a ringing of a waveform by adjusting the length of a branch wiring on the DIMM.

However, in the constitution of the above module substrate, the length of the branch wiring has been defined to be short, i.e., 3 mm or so, according to the DIMM standard. For this reason, conventionally, the wiring length of the extraction wiring is shortened by arranging the via hole adjacently to the mounting pad, thereby resultingly shortening the wiring length of the branch wiring. However, in the event that a large number of bus wirings such as address command wirings or the like are provided and the mounting pads are arranged at high density, there is a case where the via hole cannot be arranged between the mounting pads and is thus arranged outside the group of the mounting pads. In that case, it is necessary to prolong the wiring length of the branch wiring. As the wiring length of the branch wiring becomes long, problems of signal attenuation, and signal reflection become serious, thereby causing turbulence of signal waveforms. In other words, it causes ringing of signals. In particular, a problem concerning the waveform of the address/command signal in the DDR3-SDRAM is that there occurs a case that the ringing of the signal becomes large and thus an input voltage condition of the signal cannot be satisfied.

In consideration of such disadvantages as described above, the present invention aims to provide a printed circuit board and a printed wiring board which can suppress the ringing of the waveform of the signal received by the receiving circuit irrespective of the wiring length of the branch wiring.

SUMMARY OF THE INVENTION

A printed circuit board according to the present invention is characterized by comprising: a printed wiring board; and a first receiving circuit and a second receiving circuit, which are respectively mounted on the printed wiring board, and each of which is configured to receive a signal transmitted from a transmitting circuit through the printed wiring board, and is characterized in that the printed wiring board includes a main wiring of which a start end is electrically connected to the transmitting circuit, a first branch wiring of which one end is electrically connected to a first branch point on the main wiring and of which the other end is electrically connected to the first receiving circuit, a second branch wiring of which one end is electrically connected to a second branch point on the main wiring farther from the start end than the first branch point, and of which the other end is electrically connected to the second receiving circuit, and a first open stub wiring which includes a first connecting end electrically connected to a first connecting point on the main wiring between the start end and the first branch point, and a first open end opposite to the first connecting end.

Further features of the present invention will become apparent from the following description of exemplary embodiments with reference to the attached drawings.

BRIEF DESCRIPTION OF THE DRAWINGS

FIGS. 5A, 5B, 5C, 5D and 5E are diagrams for explaining the negative reflection from a post-stage branch point of the first branch point.

FIGS. 6A, 6B, 6C, 6D and 6E are diagrams for explaining the positive reflection from a receiving element of a post-stage receiving circuit of a first receiving circuit.

FIGS. 7A, 7B, 7C, 7D, 7E and 7F are waveform diagrams of a signal based on a simulation result and a signal based on an inferential result.

FIGS. 9A, 9B, 9C, 9D, 9E and 9F are waveform diagrams indicating a result obtained by performing a simulation in the wiring constitution of an Example 1.

FIGS. 12A, 12B, 12C, 12D, 12E and 12F are waveform diagrams indicating a result obtained by performing a simulation in the wiring constitution of an Example 2.

FIGS. 15A, 15B and 15C are waveform diagrams according to difference of an effective branch-wiring length in the memory system of the comparative example.

DESCRIPTION OF THE EMBODIMENTS

Hereinafter, embodiments of the present invention will now be described in detail with reference to the accompanying drawings.

First Embodiment

Figure 1:
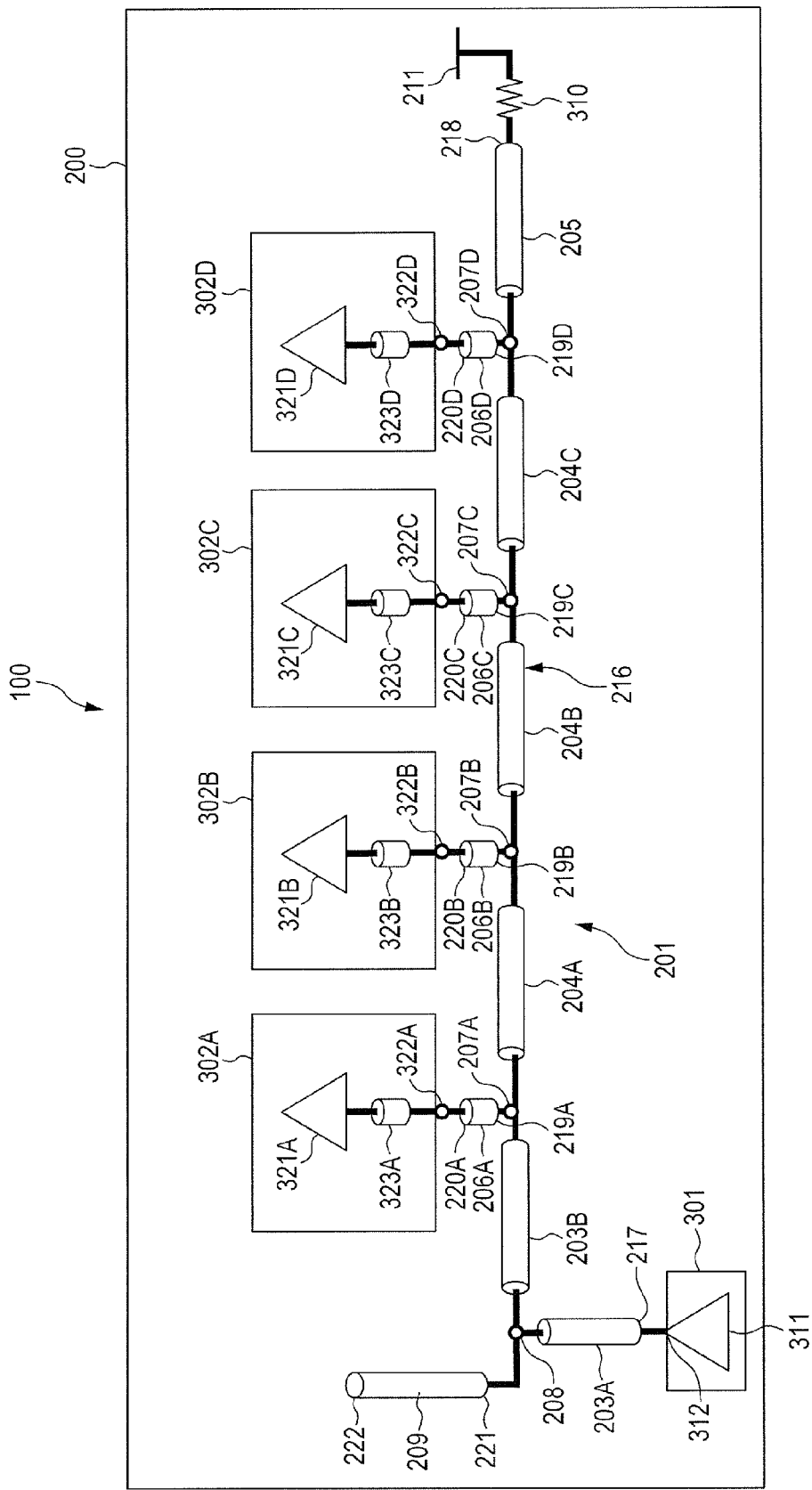
FIG. 1 is a topology diagram illustrating a wiring constitution of a memory system as an example of a printed circuit board according to a first embodiment of the present invention.

FIG. 1 is a topology diagram illustrating a wiring constitution of a memory system as an example of a printed circuit board according to the first embodiment of the present invention. A memory system 100, which is a printed circuit board, has a motherboard 200 serving as a printed wiring board, a memory controller 301 serving as a transmitting circuit and a plurality of memory devices 302A to 302D serving as a plurality of receiving circuits. In the first embodiment, the memory devices 302A to 302D are DDR3-SDRAM (Double Data Rate 3 Synchronous Dynamic Random Access Memories). The memory controller 301 and the plurality of memory devices 302A to 302D are mounted on the motherboard 200.

The memory controller 301 controls the memory devices 302A to 302D. The memory controller 301 transmits a signal, in the first embodiment, an address/command signal to the memory devices 302A to 302B through the motherboard 200.

The respective memory devices 302A to 302D receive the address/command signal transmitted from the memory controller 301 through the motherboard 200. The memory controller 301 performs transmission and reception of a data signal with the respective memory devices 302A to 302D.

In the first embodiment, a bus wiring for the address signal and a bus wiring for the command signal have such the wiring constitution according to a fly-by method, and the one of these bus wirings is illustrated in FIG. 1.

The memory controller 301 is, especially, a semiconductor package having a transmitting chip 311 composed of a semiconductor chip serving as a transmitting element and a transmitting terminal 312 connected to the transmitting chip 311.

The respective memory devices 302A to 302D are semiconductor packages having memory cells 321A to 321D composed of semiconductor chips serving as receiving elements and receiving terminals 322A to 322D connected to the memory cells 321A to 321D through internal wirings 323A to 323D. The internal wirings 323A to 323D are effective wirings of the memory devices 302A to 302D.

The motherboard 200 has a bus wiring 201 which connects the memory controller 301 (transmitting element) to the memory devices 302A to 302D (receiving elements) by a fly-by method. The bus wiring 201 has a main wiring 216, of which a start end 217 is electrically connected to the transmitting terminal 312 of the memory controller 301 and a terminal end 218 is electrically connected to one end of a terminal end resistor 310. The other end of the terminal end resistor 310 is electrically connected to a terminal end wiring 211 to which the terminal end potential is applied.

The bus wiring 201 has branch wirings 206A to 206D for electrically connecting the receiving terminals 322A to 322D of the memory devices 302A to 302D to branch points 207A to 207D located on positions different from each other on the main wiring 216. When it is especially described, one ends 219A to 219D of the respective branch wirings 206A to 206D are electrically connected to the respective branch points 207A to 207D. In addition, the other ends 220A to 220D of the respective branch wirings 206A to 206D are electrically connected to the receiving terminals 322A to 322D of the respective memory devices 302A to 302D.

In the first embodiment, the memory device 302A is a first receiving circuit and the memory device 302B is a second receiving circuit. The memory device 302C is a third receiving circuit and the memory device 302D is a fourth receiving circuit. Incidentally, in the first embodiment, although a case that the memory devices 302A to 302D are respectively one device will be described, these memory devices may be respectively plural devices.

The branch point 207A is a first branch point, and the branch point 207B is a second branch point, of which the position is farther from the start end 217 of the main wiring 216 than the branch point 207A. The branch point 207C is a third branch point, of which the position is farther from the start end 217 of the main wiring 216 than the branch point 207B. The branch point 207D is a fourth branch point, of which the position is farther from the start end 217 of the main wiring 216 than the branch point 207C.

The branch wiring 206A is a first branch wiring and the branch wiring 206B is a second branch wiring. The branch wiring 206C is a third branch wiring and the branch wiring 206D is a fourth branch wiring.

In the first embodiment, a connecting point 208 which is a first connecting point on the main wiring between the start end 217 and the branch point 207A is provided on the main wiring 216 as illustrated in FIG. 1. The motherboard 200 has a connecting end 221, which is a first connecting end electrically connected to the connecting point 208, and an open stub wiring 209, which is a first open stub wiring having an open end 222, which is a first open end located at the opposite side to the connecting end 221.

The main wiring 216 has a wiring 203A laid between the start end 217 and the connecting point 208, a wiring 203B laid between the connecting point 208 and the branch point 207A, a wiring 204A laid between the branch point 207A and the branch point 207B and a wiring 204B laid between the branch point 207B and the branch point 207C. In addition, the main wiring 216 has a wiring 204C laid between the branch point 207C and the branch point 207D and a wiring 205 laid between the branch point 207D and the terminal end 218.

In the first embodiment, the main wiring 216 is formed in an inner layer or on an outer layer of the motherboard 200, and the branch wirings 206A to 206D are formed with a state of lying between the inner layer and the outer layer of the motherboard 200. The memory devices 302A to 302D, which are BSA (Bail Grid Array) semiconductor packages, are mounted on the outer layer of the motherboard 200.

Figure 2:
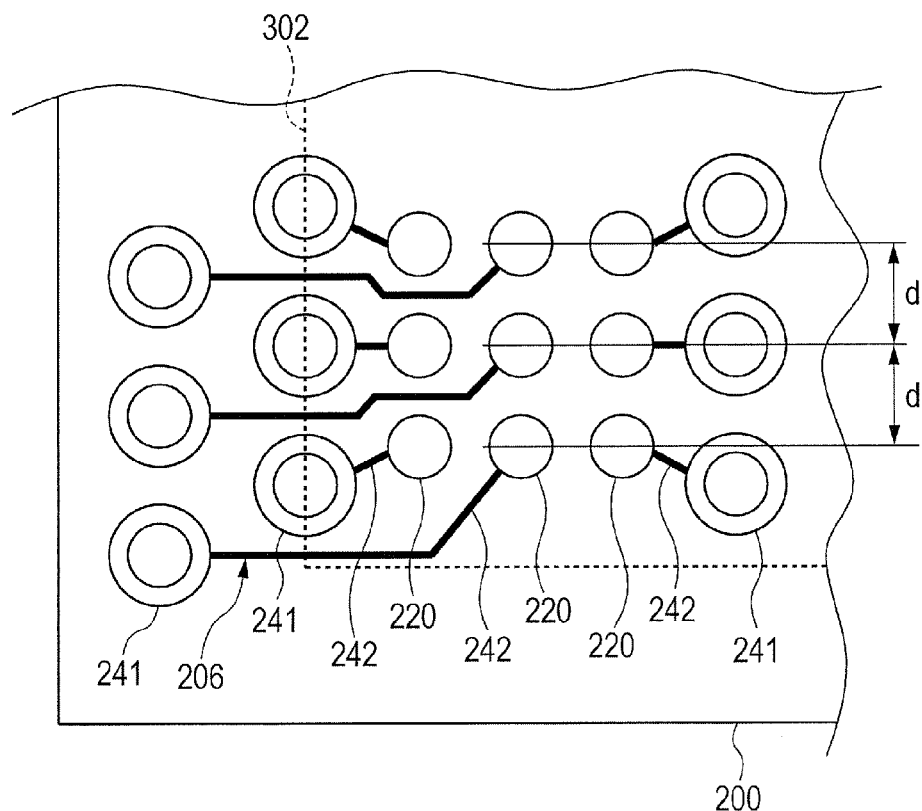
FIG. 2 is a plan view of a motherboard, which indicates an area close to a portion, on which memory devices are to be mounted.

FIG. 2 is a plan view of a motherboard, which indicates an area close to a portion, on which memory devices are to be mounted.

In FIG. 2, a plurality (nine) of main wirings 216 are formed in a not-illustrated inner layer, and the branch wirings 206 are provided on the respective main wirings 216. That is, one of the memory devices 302A to 302D in FIG. 1 is regarded as the memory device 302, and one of the branch wirings 206A to 206D is regarded as the branch wiring 206. Although they are not illustrated, the plurality of receiving terminals 322 are provided in array on the bottom face of the memory device 302.

The branch wiring 206 has a via hole 241 electrically connected to the main wiring 216, a mounting pad 220, which is the other end of the branch wiring 206, formed on the outer layer and an extraction wiring pattern 242 for electrically connecting the via hole 241 to the mounting pad 220. The plurality of mounting pads 220, which are disposed in array, are electrically connected to the receiving terminals 322 of the memory device 302 by a connecting conductor such as a solder ball or the like not illustrated.

Since the via hole 241, which is disposed at the outside of a mounting pads group composed of the plurality of mounting pads 220, can be formed to have an arbitrary diameter, a cheap motherboard 200 is realized. A distance d between the mounting pads 220 and 220 becomes, for example, a pitch of 0.8 mm. The maximum of the wiring length from the one end 219 to the other end 220 of the branch wiring 206 at that time becomes about 8 mm.

Here, a case that the open stub wiring 209 does not exist on the motherboard 200 of the present embodiment will be described as a comparative example.

Figure 14:
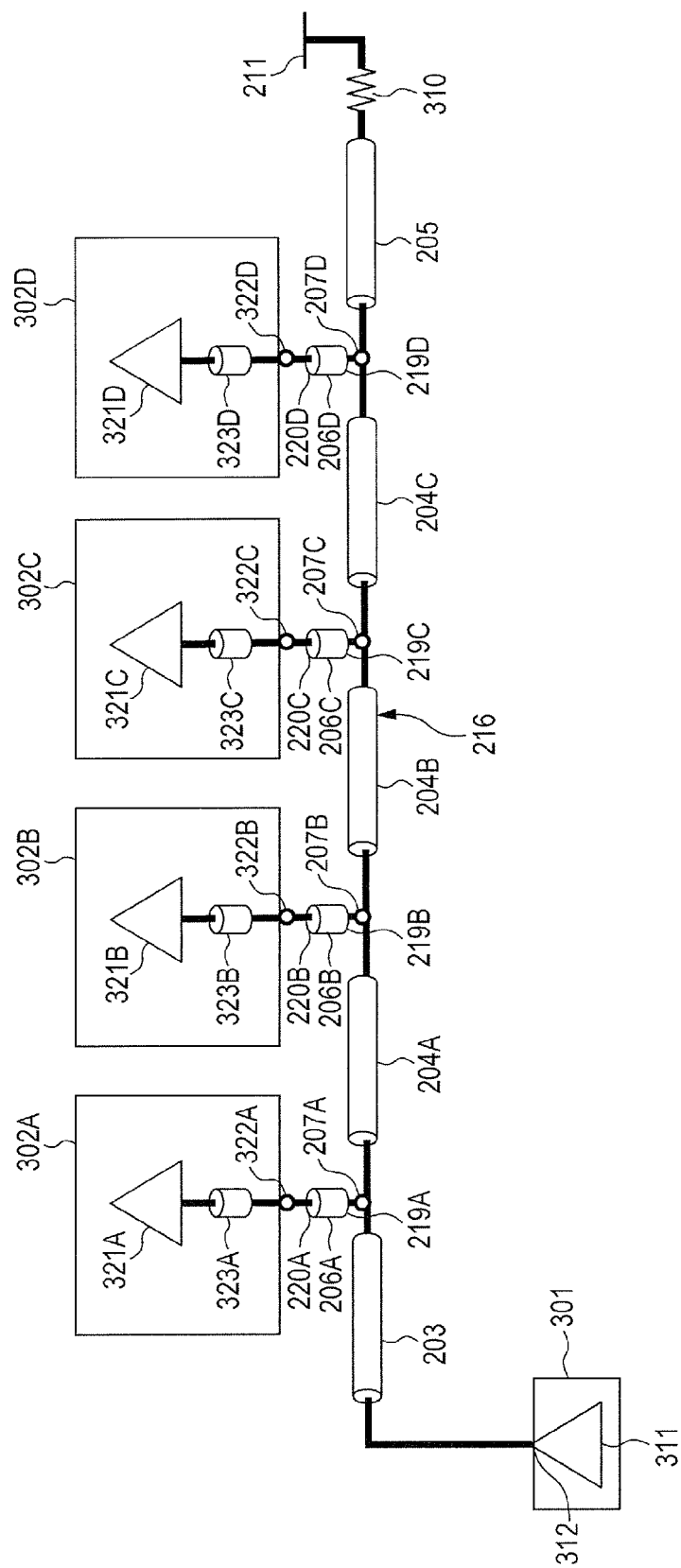
FIG. 14 is a topology diagram illustrating the wiring constitution of a memory system as an example of a printed circuit board of a comparative example.

FIG. 14 is a topology diagram illustrating the wiring constitution of a memory system as an example of a printed circuit board of the comparative example. Note that the printed circuit board illustrated in FIG. 14 does not have the open stub wiring 209 as compared with the printed circuit board illustrated in FIG. 1, and the constitution excepting this point is similar to that of this first embodiment.

As the wiring length of the branch wirings 206A to 206D becomes long, a problem about the attenuation or reflection of a signal becomes serious, and this fact causes turbulence of waveforms. Especially, a problem concerning a waveform of an address/command signal of the DDR3-SDRAM is that there occurs a case that a ringing of a signal becomes large and an input voltage condition of a signal cannot be satisfied.

A size of a land of the via hole 241 which can be used in the cheap motherboard 200 as illustrated in FIG. 2 is about φ0.6 mm, and a size of the mounting pad 220 is about φ0.6 mm. For this reason, the via hole 241 cannot be disposed between the mounting pads 220 and 220 having a pitch of 0.8 mm. Therefore, the via hole 241 is disposed at the outside of the memory device 302. As a result, the length of the extraction wiring pattern 242 from the via hole 241, which is on the main wiring, to the mounting pad 220 becomes long, and there easily occurs a problem of the input voltage condition of a signal of the above waveform.

The transmission delay taken to reach the memory cells 321 exists inside the memory device 302 due to the package wiring or the internal capacity. A replaced one obtained by replacing this transmission delay with a length on the printed wiring board is considered as an effective wiring length of the internal wiring 323. The branch wiring length including this effective wiring length of the internal wiring 323, that is, the sum of the wiring lengths of the internal wiring 323 and the branch wiring 206 has such dispersion of about 10 mm to 20 mm even in general case, and it is required to consider about the wider dispersion when considering difference of memory vendors or intergenerational difference of the memories. Hereinafter, the sum of the wiring lengths of the internal wiring 323 and the branch wiring 206 is called an effective branch-wiring length.

FIGS. 15A, 15B and 15C are waveform diagrams according to difference of the effective branch-wiring length in the memory system of the comparative example. FIG. 15A indicates a waveform in a case that the effective branch-wiring length is 20 mm, FIG. 15B indicates a waveform in a case that the effective branch-wiring length is 15 mm and FIG. 15C indicates a waveform in a case that the effective branch-wiring length is 10 mm. Incidentally, it is assumed that signal voltage at the memory device 302A is $V_{31}$, signal voltage at the memory device 302B is $V_{32}$, signal voltage at the memory device 302C is $V_{33}$ and signal voltage at the memory device 302D is $V_{34}$.

As the sum of the wiring lengths of the internal wiring 323A and the branch wiring 206A becomes long, a degree of the ringing of waveform becomes large. Also, there is a case that a degree of the ringing further becomes large by the influence of a noise such as a crosstalk or the like, and it is required to have the voltage difference far from a threshold voltage as much as possible in terms of the design.

As indicated in FIG. 15A, the voltage $V_{31}$ of a signal, which the memory device 302A receives among the memory devices 302A to 302D, does not satisfy the input voltage condition. The threshold voltages $V_L$ and $V_H$ usually have the voltage difference of 200 mV depending on the magnitude of the input voltage condition, and when the voltage of a signal is higher than the voltage $V_H$, a logical value becomes "high", and when the voltage of a signal is lower than the voltage $V_L$, a logical value becomes "low". However, when the voltage of a signal stays between the voltage $V_H$ and the voltage $V_L$, the logical value becomes unstable. Therefore, when the voltage is varied, it becomes a problem on an operation that a signal once exceeds the input voltage condition of a signal enters between the voltage $V_H$ and the voltage $V_L$ again because of the ringing.

It was found that a main factor of generating the ringing of a waveform of a signal, which reaches the memory device 302A, is the negative reflection from the branch point 207B of the main wiring 216 and the negative reflection from the branch point 207A of the main wiring 216 at the branch wiring 206A. It was found that, especially, the negative reflection from the branch point 207B of the main wiring 216 becomes a big factor. Hereinafter, these factors will be specifically described.

Figure 3:
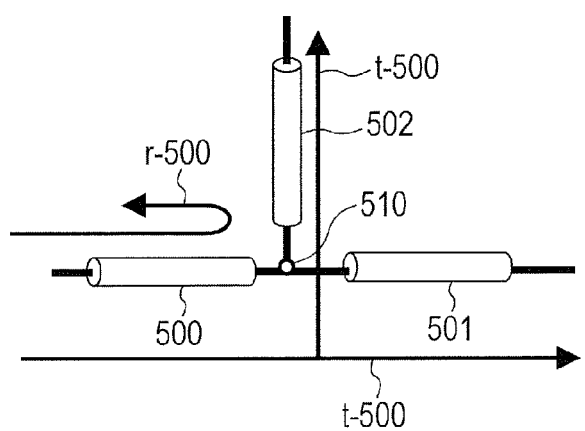
FIG. 3 is a diagram for explaining reflection of a signal component at a branch point.

FIG. 3 is a diagram for explaining reflection of a signal component at a branch point. In FIG. 3, a wiring 500 having characteristic impedance $Z_1$, a wiring 501 having characteristic impedance $Z_2$ and a wiring 502 having characteristic impedance $Z_3$ are connected to each other at a connecting point 510. It is assumed that a signal is transmitted from the side of the wiring 500. In FIG. 3, a route r-500, where a signal transmitted from the side of the wiring 500 is returned by generating reflection at the connecting point 510, and a route t-500, where the same signal is transmitted through the connecting point 510 and transmitted to the wirings 501 and 502, are illustrated.

Combined impedance $Z_a$ of the wiring 501 and the wiring 502 observed from the side of the wiring 500 is expressed by the following expression (1).

$$Z_a=(Z_2*Z_3)/(Z_2+Z_3) \quad (1)$$

For example, when the characteristic impedance $Z_2$ and the characteristic impedance $Z_3$ are respectively 50Ω, the combined impedance $Z_a$ becomes 25Ω.

A voltage ratio when a signal transmitted from the side of the wiring 500 reflects at the connecting point 510 is expressed by the following expression (2).

$$(Z_a-Z_1)/(Z_a+Z_1) \quad (2)$$

For example, when the characteristic impedance $Z_1$ is 50Ω and the combined impedance $Z_a$ is 25Ω, a value of the expression (2) becomes −1/3, and the voltage is reflected with a ratio of −1/3.

A voltage ratio when a signal transmitted from the side of the wiring 500 is transmitted through the connecting point 510 is expressed by the following expression (3).

$$2Z_a/(Z_a+Z_1) \quad (3)$$

For example, when the characteristic impedance $Z_1$ is 50Ω and the combined impedance $Z_a$ is 25Ω, a value of the expression (3) becomes 2/3, and the voltage is reflected with a ratio of 2/3.

Figure 4A:
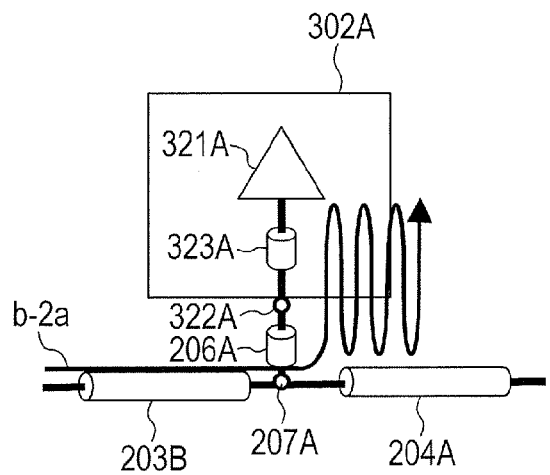
FIGS. 4A, 4B and 4C are diagrams for explaining the negative reflection from a first branch point of a main wiring on a first branch wiring.
Figure 4B:
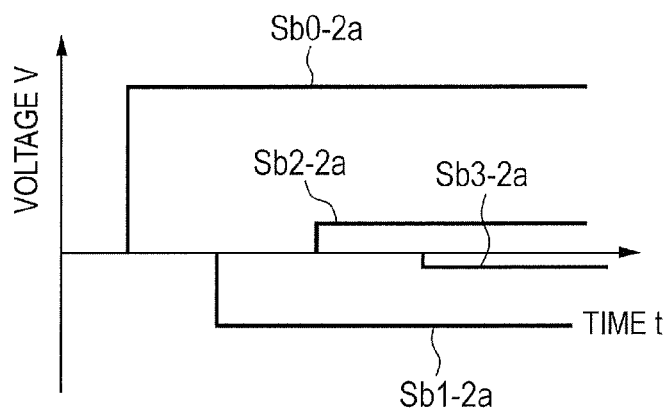
Figure 4C:
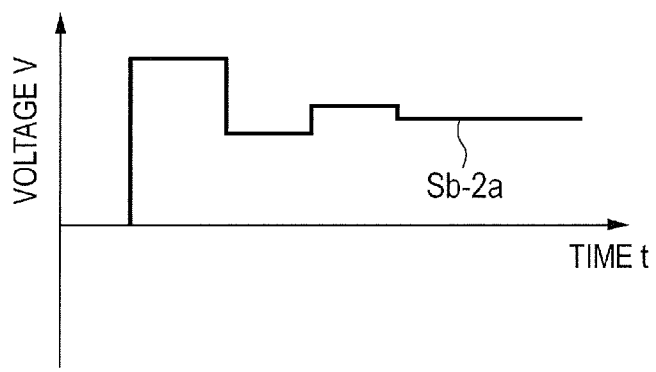

FIGS. 4A, 4B and 4C are diagrams for explaining the negative reflection from the branch point 207A of the main wiring 216 on the branch wiring 206A.

FIG. 4A is the partial topology diagram indicating a branch portion of the memory device 302A. In FIG. 4A, a signal component, reciprocating between the branch point 207A and the memory cell 321A is illustrated. A signal route b-2a of this signal component is such a route, which reciprocates between the branch point 207A and the memory cell 321A.

A signal being transmitted through the wiring 203B is first transmitted through the branch point 207A and then transmitted to the memory cell 321A, which is a receiving element, via the effective infernal wiring 323A of the branch wiring 206A and the memory device 302A.

Here, in order to be able to simply consider, it will be described based on a case that difference of the characteristic impedance between the branch wiring 206A and the internal wiring 323A is extremely small and a signal wave from the branch wiring 206A to the internal wiring 323A is transmitted through as it is. As for the memory cell 321A, it will be described based on a case of approximating the high impedance (infinite impedance).

The signal wave transmitted to the memory cell 321A is totally reflected on the memory cell 321A, and the reflected wave of the intact voltage returns to the branch point 207A via the internal wiring 323A and the branch wiring 206A. A reflected wave of the returned signal is reflected at the branch point 207A. A reflected wave at this branch paint 207A is such a reflected wave of which the voltage has a voltage ratio of −1/3 for an incident wave. The reflected wave reflected at the branch point 207A is transmitted to the memory cell 321A via the branch wiring 206A and the internal wiring 323A again.

FIG. 4B is the waveform diagram which individually indicates voltages of the signal waves transmitted to the memory cell 321A at that time. Here, it will be described based on a case that all the wirings have the same characteristic impedance. A graph of a signal wave Sb0-2a indicates the voltage of a signal wave (direct wave) first transmitted to the memory cell 321A. That is, the signal Sb0-2a is a direct wave directly transmitted to the branch wiring 206A (memory device 302A, that is, memory cell 321A) from the start end 217. Specifically, the signal wave Sb0-2a is such a signal wave which is to be transmitted to the memory device 302 (memory cell 321A) from the start end 217 via the wirings 203A, 203R, 206A (and wiring 323A).

A signal wave (reflected wave) Sb1-2a is such a signal wave formed by a process that the signal wave Sb0-2a totally reflected on the memory cell 321A is reflected at the branch point 207A to be reflected with the voltage having the voltage ratio of −1/3. That, is, the signal wave (reflected wave) Sb1-2a is such a reflected wave formed by a process that the signal wave Sb0-2a is first reflected to the side of the branch point 207A on the memory cell 321A of the memory device 302A and further reflected to the side of the memory device 302A on the branch point 207A. The signal wave Sb1-2a reaches the memory cell 321A delayed by a period corresponding to one-reciprocal motion from the internal wiring 323A to the branch wiring 206A for the signal wave Sb0-2a.

A signal wave (reflected wave) Sb2-2a is such a signal wave formed by a process that the signal wave Sb1-2a totally reflected on the memory cell 321A is reflected at the branch point 207A to be reflected with the voltage having the voltage ratio of +1/9. The signal wave Sb2-2a reaches the memory cell 321A delayed by a period corresponding to two-reciprocal motion from the internal wiring 323A to the branch wiring 206A for the signal wave Sb0-2a.

A signal wave (reflected wave) Sb3-2a is such a signal wave formed by a process that the signal wave Sb2-2a totally reflected on the memory cell 321A is reflected at the branch point 207A to be reflected with the voltage having the voltage ratio of −1/27. The signal wave Sb3-2a reaches the memory cell 321A delayed by a period corresponding to three-reciprocal motion from the internal wiring 323A to the branch wiring 206A for the signal wave Sb0-2a.

FIG. 4C is the waveform diagram indicating the total voltage of all the signal waves Sb0-2a, Sb1-2a, Sb2-2a and Sb3-2a. A waveform of the totalized signal wave Sb-2a is varied as indicated in FIG. 4C by the negative reflection from the branch point. 207A of the main wiring 216 on the branch wiring 206A.

FIGS. 5A, 5B, 5C, 5D and 5E are diagrams for explaining the negative reflection from post-stage branch points 207B, 207C and 207D of the branch point 207A. FIG. 5A is the topology diagram for explaining a reflection route ma-2a extended from the branch point 207B. The route ma-2a of a signal wave transmitted from the transmitting chip 311 of the memory controller 301 is such a route which passes through the wirings 203A, 203B and 204A and turns back at the branch point 207B and passes through the wirings 204A, 206A and 323A and then reaches the memory cell 321A.

FIG. 5B is the topology diagram for explaining a reflection route mb-2a extended from the branch point 207C. The route mb-2a of a signal wave transmitted from the transmitting chip 311 is such a route which passes through the wirings 203A, 203B, 204A and 204B and turns back at the branch point 207C and passes through the wirings 204B, 204A, 206A and 323A and then readies the memory cell 321A.

FIG. 5C is the topology diagram for explaining a reflection route mb-2a extended from the branch point 207D. The route mb-2a of a signal wave transmitted from the transmitting chip 311 is such a route which passes through the wirings 203A, 203B and 204A to 204C and turns back at the branch point 207D and passes through the wirings 204C to 204A, 206A and 323A and then reaches the memory cell 321A.

FIG. 5D is the waveform diagram which individually indicates signal waves Sma-2a, Smb-2a and Smc-2a which pass through respective routes ma-2a, mb-2a and mc-2a and reach the memory cell 321A.

The signal wave Sma-2a, which passes through the route ma-2a, is transmitted through the wirings 203A and 203B, attenuated at the branch point 207A, transmitted through the wiring 204A, negative reflected at the branch point 207B and transmitted through the wiring 204A. Further, the signal wave Sma-2a is attenuated at the branch point 207A, transmitted through the wiring 206A and the internal wiring 323A and then reaches the memory cell 321A.

That is, the signal wave Sma-2a is such a reflected wave, which sequentially passes through the wirings 203A, 203R and 204A from the start end 217 and reciprocates one time on the wiring 204A by reflecting to the side of the branch point 207A at the branch point 207B and then to be transmitted to the other end 220A through the branch wiring 206A. Therefore, the signal wave Sma-2a reaches the memory device 302A (memory cell 321A), that is, the branch point 207A delayed by a transmission delay time corresponding to a period of reciprocating one time on the wiring 204A for the signal wave Sb0-2a indicated in FIG. 4B.

The signal wave Smb-2a, which passes through the route mb-2a, is transmitted through the wirings 203A and 203B, attenuated at the branch point 207A, transmitted through the wiring 204A, attenuated at the branch point 207B, transmitted through the wiring 204B and negative reflected at the branch point 207C. Further, the signal wave Smb-2a is transmitted through the wiring 204B, attenuated at the branch point 207B, transmitted through the wiring 204A, attenuated at the branch point 207A, transmitted through the branch wiring 206A and the internal wiring 323A and then reaches the memory cell 321A. Therefore, the signal wave Smb-2a is more attenuated than the signal wave Sma-2a, and reaches the memory cell 321A (branch point 207A) delayed by a transmission delay time corresponding to a period of reciprocating one time from the wiring 204A to the wiring 204B for the signal wave Sb0-2a indicated in FIG. 4B.

The signal wave Smc-2a, which passes through the route mc-2a, is transmitted through the wirings 203A and 203B, attenuated at the branch point 207A, transmitted through the wiring 204A, attenuated at the branch point 207B, transmitted through the wiring 204B, attenuated at the branch point 207C and transmitted through the wiring 204C. Further, the signal wave Smc-2a is negative reflected at the branch point 207D, transmitted through the wiring 204C, attenuated at the branch point 207C, transmitted through the wiring 204B, attenuated at the branch point 207B, transmitted, through the wiring 204A and attenuated at the branch point 207A. Further, the signal wave Smc-2a is transmitted through the branch wiring 206A and the internal wiring 323A and then reaches the memory cell 321A. Therefore, the signal wave Smc-2a is more attenuated than the signal wave Smb-2a, and reaches the memory cell 321A (branch point 207A) delayed by a transmission delay time corresponding to a period of reciprocating one time from the wiring 204A to the wiring 204C for the signal wave Sb0-2a indicated in FIG. 4B.

FIG. 5E is the waveform diagram indicating the total voltage of all the signal waves Sma-2a, Smb-2a and Smc-2a. A waveform of the totalized signal wave Sm-2a is varied as indicated in FIG. 5E by the negative reflection from the branch points 207B to 207D.

FIGS. 6A, 6B, 6C, 6D and 6E are diagrams for explaining the positive reflection from the post-stage memory cells 321B, 321C and 321D of the memory cell 321A. FIG. 6A is the topology diagram for explaining a reflection route pa-2a extended from the memory cell 321B. The route pa-2a of a signal wave is such a route which passes through the wirings 203A to 204A, 206B and 323B, turns back on the memory cell 321B, passes through the wirings 323B, 206B, 204A, 206A and 323A and reaches the memory cell 321A.

FIG. 6B is the topology diagram for explaining a reflection route pb-2a extended from the memory cell 321C. The route pb-2a of a signal wave is such a route which passes through the wirings 203A to 204B, 206C and 323C, turns back on the memory cell 321C, passes through the wirings 323C, 206C, 204B, 204A, 206A and 323A and reaches the memory cell 321A.

FIG. 6C is the topology diagram for explaining a reflection route pc-2a extended from the memory cell 321D. The route pc-2a of a signal wave is such a route which passes through the wirings 203A to 204C, 206D and 323D, turns back on the memory cell 321D, passes through the wirings 323D, 206D, 204C to 204A, 206A and 323A and reaches the memory cell 321A.

FIG. 6D is the waveform diagram which individually indicates signal waves Spa-2a, Spb-2a and Spc-2a which pass through respective routes pa-2a, pb-2a and pc-2a and reach the memory cell 321A.

The signal wave Spa-2a, which passes through the route pa-2a, is transmitted through the wirings 203A and 203B, attenuated at the branch point 207A, transmitted through the wiring 204A, attenuated at the branch point 207B, transmitted through the wirings 206B and 323B and positive reflected on the memory cell 321B. Further, the signal wave Spa-2a is transmitted through the wirings 323B and 206B, attenuated at the branch point 207B, transmitted through the wiring 204A, attenuated at the branch point 207A, transmitted through the wirings 206A and 323A and then reaches the memory cell 321A. Therefore, the signal wave Spa-2a reaches the memory cell 321A (branch point 207A) more delayed than the signal wave Sma-2a indicated in FIG. 5D by a transmission delay time corresponding to a period of reciprocating one time from the wiring 204A to the wiring 323B via the wiring 206B tor the signal wave Sb0-2a indicated in FIG. 4B.

The signal wave Spb-2a, which passes through the route pb-2a, is transmitted through the wirings 203A and 203B, attenuated at the branch point 207A, transmitted through the wiring 204A, attenuated at the branch point 207B, transmitted through the wiring 204B, attenuated at the branch point 207C and transmitted through the wirings 206C and 323C. Further, the signal wave Spb-2a is positive reflected on the memory cell 321C, transmitted through the wirings 323C and 206C, attenuated at the branch point 207C, transmitted through the wiring 204B, attenuated at the branch point 207B, transmitted through the wiring 204A and attenuated at the branch point 207A. Further, the signal wave Spb-2a transmitted through the wirings 206A and 323A and then reaches the memory cell 321A. Therefore, the signal wave Spb-2a is more attenuated than the signal wave Spa-2a, and reaches the memory cell 321A (branch point 207A) delayed by a transmission delay time corresponding to a period of reciprocating one time from the wiring 204A to the wiring 323C via the wirings 204B and 206C for the signal wave Sb0-2a indicated in FIG. 4B.

The signal wave Spc-2a, which passes through the route pc-2a, is transmitted through the wirings 203A and 203B, attenuated at the branch point 207A, transmitted through the wiring 204A, attenuated at the branch point 207B, transmitted through the wiring 204B, attenuated at the branch point 207C and transmitted through the wiring 204C. Further, the signal wave Spc-2a is attenuated at the branch point 207D, transmitted through the wirings 206D and 323D, positive reflected on the memory cell 321D, transmitted through the wirings 323D and 206D, attenuated at the branch point 207D, transmitted through the wiring 204C and attenuated at the branch point 207C. Further, the signal wave Spc-2a is transmitted through the wiring 204B, attenuated at the branch point 207B, transmitted through the wiring 204A, attenuated at the branch point 207A, transmitted through the wirings 206A and 323A and then reaches the memory cell 321A. Therefore, the signal wave Spc-2a is more attenuated than the signal wave Spb-2a, and reaches the memory cell 321A (branch point 207A) delayed by a transmission delay time corresponding to a period of reciprocating one time from the wiring 204A to the wiring 323D via the wirings 204B, 204C and 206D for the signal wave Sb0-2a indicated in FIG. 4B.

FIG. 6E is the waveform diagram indicating the total voltage of all the signal waves Spa-2a, Spb-2a and Spc-2a. A waveform of the totalized signal wave Sp-2a is varied as indicated in FIG. 6E by the positive reflection from the memory cells 321A to 321D.

FIGS. 7A, 7B, 7C, 7D, 7E and 7F are waveform diagrams of a signal based on a simulation result and a signal based on an inferential result. FIGS. 7A, 7B and 7C are the waveform diagrams of signals to be received at the memory device 302A in case of performing a simulation under the following conditions in the wiring constitution illustrated in FIG. 1. In order to perform a waveform analysis according to impedance of the wiring, a start-up time is kept to become long and the memory device 302A is set to be in a non-load condition.

The conditions of simulation are as follows. The voltage of a signal (pulse), which the memory controller 301 transmits, is set to 1.5V, the internal characteristic impedance is set to 50Ω, a signal start-up time is set to 1000V/ns and loads of the memory devices 302A to 302D are approximated to the non-load defined by 0 pF.

The characteristic impedance of all the wirings is set to 50Ω and a delay time is set to 7 ns/m. The total wiring length of the wiring 203A and the wiring 203B is set to 45 mm, the wiring length of the respective wirings 204A, 204B and 204C is set to 15 mm and the wiring length of the wiring 205 is set to 10 mm. A resistance value of the terminal end resistor 310 is set to 50Ω and the terminal end potential applied to the terminal end wiring 211 is set to 0.75V.

In addition, the total wiring length (effective branch wiring length) of the wiring length of the branch wirings 206A to 206D on the motherboard 200 and the effective wiring length of the inside the memory devices 302A to 302D was set under three kinds of conditions of 20 mm, 15 mm and 10 mm. FIG. 7A indicates a case that the effective branch wiring length is 20 mm, FIG. 7B indicates a case that the effective branch wiring length is 15 mm and FIG. 7C indicates a case that the effective branch wiring length is 10 mm.

In FIGS. 7D, 7E and 7F, the waveforms of three signal waves Sb-2a, Sm-2a and Sp-2a described by using FIGS. 4A, 4B and 4C, FIGS. 5A, 5B, 5C, 5D and 5E and FIGS. 6A, 6B, 6C, 6D and 6E and further, the inferential waveforms of signal waves SA respectively obtained by totalizing waveforms of the three signal waves are illustrated FIG. 7D indicates a case that the effective branch wiring length is 20 mm, FIG. 7E indicates a case that the effective branch wiring length is 15 mm, and FIG. 7F indicates a case that the effective branch wiring length is 10 mm.

A simulation result coincides with an inferential result regarding the respective effective branch wiring lengths, and it was found that portions having the largest ringing of signal waveforms are generated at the signal wave Sb1-2a and the signal wave Sma-2a. That is, it was found that the ringing is caused by a reflected wave due to the first negative reflection from the branch point 207A and a reflected wave due to the negative reflection from the branch point 207B. It was found that an influence of the reflected wave due to the negative reflection from the branch point 207B is especially serious.

Therefore, in the first embodiment, the open stub wiring 209 of which the length copes with the reflected wave due to the negative reflection from the branch point 207B is added.

Figure 8A:
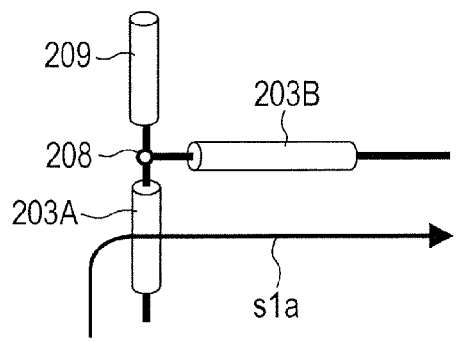
FIGS. 8A, 8B and 8C are diagrams for explaining signal waves obtained by adding a first open stub wiring.
Figure 8B:
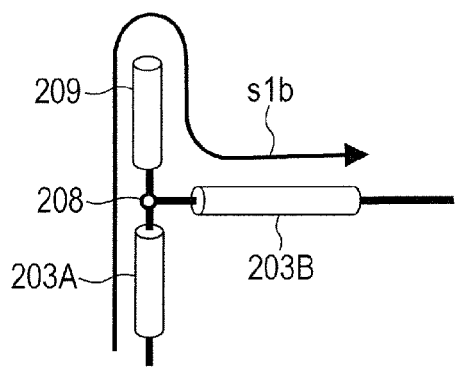
Figure 8C:
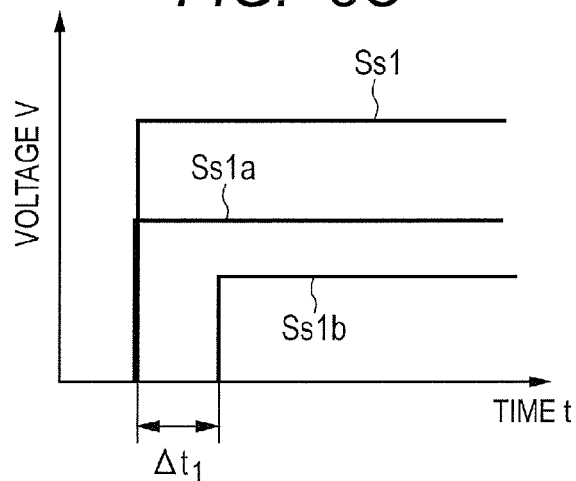

FIGS. 8A, 8B and 8C are diagrams for explaining signal waves obtained by adding the open stub wiring 209. FIG. 8A is the diagram for explaining a route s1a of a direct wave. FIG. 8B is the diagram for explaining a route s1b of a reflected wave to be generated on the open stub wiring 209. FIG. 8C is the waveform diagram indicating waveforms of the respective signal waves reaching the memory device 302A. Here, a reference symbol Ss1 denotes a Waveform in a case that the open stub wiring 209 does not exist.

A reflected wave Ss1b due to the positive reflection generates at the open end 222 of the open stub wiring 209. Therefore, the length of the open stub wiring 209 is set to become such the wiring length defined in that the reflected wave Ss1b due to the positive reflection is overlapped with the signal wave Sma-2a (FIG. 5D) due to the negative reflection on the memory device 302A (memory cell 321A), that is, the branch point 207A. The length of the open stub wiring 209 is set to become such the wiring length defined in that the reflected wave Ss1b reflected at the open end 222 reaches the branch point 207A (FIG. 1) delayed by a transmission delay time $\Delta_{t1}$, which is a predetermined first transmission delay time, for a direct wave Ss1a (signal wave Sb0-2a in FIG. 4B). Note that the wiring length of the open stub wiring 209 is such a length from the connecting end 221 to the open end 222. This transmission delay time $\Delta_{t1}$ is a necessary delay time to reduce the signal wave Sma-2a (FIG. 5D) at the memory device 302A (memory cell 321A), that is, the branch point 207A. Namely, it is a delay time defined in that the reflected wave Ss1b due to the positive reflection is overlapped with the signal wave Sma-2a due to the negative reflection at the branch point 207A.

Accordingly, the signal wave Sma-2a is attenuated by the reflected wave Ss1b to be converged at the branch point 207A, and the attenuated signal wave reaches the memory device 302A (memory cell 321A). Incidentally, if the voltage of the signal wave Sma-2a is equal to the voltage of the reflected wave Ss1b, the voltage of the signal wave Sma-2a which reaches the memory device 302A (memory cell 321A) becomes 0V due to the offset result.

It is preferable that a delay time of the signal wave Sma-2a for the signal wave Ss1a due to the wiring 204A is substantially equal to a delay time of the reflected wave Ss1b for the signal wave Ss1a due to the open stub wiring 209.

That is, it is preferable that the wiring length of the open stub wiring 209 is substantially equal to the wiring length of the wiring 204A. Here, the above "substantially equal" includes not only a case that the wiring lengths are equal to each other but also a case that a reduction effect for the signal wave Sm-2a corresponds to an error within a certain range. Although it is preferable that the open stub wiring 209 is linearly formed, it may be crookedly formed.

In this manner, the positive signal wave Ss1b, which is delayed by a transmission delay time corresponding to a period of reciprocating one time on the open stub wiring 209, can be generated by the open stub wiring 209. Consequently, the signal wave Ss1b can be overlapped with the signal wave Sma-2a at the branch point 207A, and the main negative signal wave Sma-2a to be generated can be attenuated. Therefore, the ringing of a signal which reaches the memory device 302A (memory cell 321A) can be suppressed. In addition, since the size of a signal which is first transmitted to the branch point 207A becomes a small size by adding the open stub wiring 209, the size of a signal which branches at the branch point 207A also becomes a small size, and since the size of the signal wave Sma-2a reflected at the branch point 207B also becomes a small size, there is also an effect of suppressing the magnitude of the ringing.

That is, according to the first embodiment, the positive reflected wave coping with the negative reflected wave, which is generated at the second branch point, can be generated by an open stub wiring. Since a reflected wave, which is generated on the open stub wiring, is overlapped with a reflected wave, which is generated at the second branch point, at the first branch point, the ringing of a signal to be reached a first receiving circuit can be suppressed.

Example 1

FIGS. 9A, 9B, 9C, 9D, 9E and 9F are waveform diagrams indicating a result obtained by performing a simulation in the wiring constitution of an Example 1. FIGS. 9A, 9B, 9C, 9D, 9E and 9F indicate a result obtained by performing a simulation under the following conditions in the wiring constitution illustrated in FIG. 1.

The voltage of a signal (pulse), which the memory controller 301 transmits, was set to 1.5V, the internal characteristic impedance was set to 50Ω, the signal start-up time was set to 2V/ns and loads of the memory devices 302A to 302D were approximated to the load defined by 1 pF. The characteristic impedance of all the wirings was set to 50Ω and the delay time was set to 7 ns/m. The wiring length of the wiring 203A was set to 5 mm, the wiring length of the wiring 203B was set to 40 mm, the wiring length of the respective wirings 204A, 204B and 204C was set to 15 mm and the wiring length of the wiring 205 was set to 10 mm. The resistance value of the terminal end resistor 310 was set to 50Ω and the terminal end potential applied to the terminal end wiring 211 was set to 0.75V.

In addition, the total wiring length (effective branch wiring length) of the wiring length of the branch wirings 206A to 206D on the motherboard 200 and the effective wiring length of the inside the memory devices 302A to 302D was set under three kinds of conditions of 20 mm, 15 mm and 10 mm. FIG. 9A indicates a case that the effective branch wiring length is 20 mm, FIG. 9B indicates a case that the effective branch wiring length is 15 mm and FIG. 9C indicates a case that the effective branch wiring-length is 10 mm.

The wiring length of the open stub wiring 209 was set to 15 mm being equal to the wiring length of the wiring 204A between the branch point 207A and the branch point 207B.

In FIGS. 9A, 9B and 9C, the voltage of a signal to be received by the memory device 302A is assumed as $V_1$, the voltage of a signal to be received by the memory device 302B is assumed as $V_2$, the voltage of a signal to be received by the memory device 302C is assumed as $V_3$ and the voltage of a signal to be received by the memory device 302D is assumed as $V_4$.

As illustrated in FIGS. 9A, 9B and 9C, a waveform (voltage $V_1$) of a signal, which the memory cell 321A of the memory device 302A receives, does not drop below the threshold voltage $V_H$ under any conditions, and it can be confirmed that the ringing of the signal is improved. Incidentally, waveforms (voltages $V_2$ to $V_4$) of signals, which the memory cells 321B to 321D of the memory devices 302B to 302D receive, also do not drop below the threshold voltage $V_H$, and the quality of signals is secured.

FIG. 9D indicates a result obtained by comparing the Example 1 with a comparative example in a case that the effective branch wiring length is 20 mm, FIG. 9E indicates a result obtained by comparing the Example 1 with a comparative example in a case that the effective branch wiring length is 15 mm and FIG. 9F indicates a result obtained by comparing the Example 1 with a comparative example in a case that the effective branch wiring length is 10 mm. As illustrated in FIGS. 9D, 9E and 9F, it can be confirmed that waveforms of the signals, which the memory cell 321A of the memory device 302A receives, are improved under all the conditions.

Next, a result obtained by performing a simulation under the following conditions will be indicated in Table 1 in order to confirm an effective condition of the wiring length of the open stub wiring 209 in the wiring constitution illustrated in FIG. 1.

TABLE 1

| Improvement amount (mV) in case of Example 1 | | | | | | |
|---|---|---|---|---|---|---|
| | | The wiring length (mm) of the wiring 204A | | | | |
| | | 10 | 15 | 20 | 25 | 30 |
| The wiring length (mm) of the open stub wiring 209 | 5 | 4 | 5 | 2 | 2 | 4 |
| | 10 | 7 | 5 | 5 | 9 | 8 |
| | 15 | 12 | 5 | 7 | 13 | 16 |
| | 20 | 49 | 26 | 25 | 28 | 32 |
| | 25 | 105 | 58 | 46 | 44 | 44 |
| | 30 | 44 | 64 | 61 | 54 | 43 |
| | 35 | −37 | −30 | −31 | −22 | −15 |
| | 40 | −90 | −86 | −82 | −74 | −56 |

The voltage of a signal (pulse), which the memory controller 301 transmits, was set to 1.5V, the internal characteristic impedance was set to 50Ω, a signal start-up time was set to 2V/ns and the load capacity of the memory devices 302A to 302D was set to 0 pF. The characteristic impedance of all the wirings was set to 50Ω and the delay time was set to 7 ns/m. The wiring length of the wiring 203A was set to 5 mm, the wiring length of the wiring 203B was set to 100 mm and the wiring length of the wiring 205 was set to 10 mm. The resistance value of the terminal end resistor 310 was set to 50Ω and the terminal end potential applied to the terminal end wiring 211 was set to 0.75V. The inspection was performed by changing the conditions by a manner that the wiring length of the respective wirings 204A, 204B and 204C was changed to become 10 mm, 15 mm, 20 mm, 25 mm and 30 mm.

In addition, the effective branch wiring length on the substrate was set under six kinds of conditions of 5 mm, 10 mm, 15 mm, 20 mm, 25 mm and 30 mm in consideration of the effective wiring length dispersion of the memory devices 302A to 302D to be mounted. Then, the improvement amount was compared, in a case that the length of the open stub wiring 209 was changed, to a comparative example of not having the open stub wiring 209 under the condition of the largest ringing.

The result indicated in Table 1 becomes such a result, where positive numbers indicate that a waveform is improved and negative numbers indicate that a waveform is not improved. The result obtained by changing the wiring length of the open stub wiring 209 is indicated within a range of dispersion (10 mm to 30 mm) of the wiring length of the wirings 204A, 204B and 204C and a range of dispersion (5 mm to 30 mm) of the effective branch wiring length to be considered. From the result in Table 1, it was confirmed that the ringing of waveform was improved in the case that the wiring length of the open stub wiring 209 was set to the length 5 mm or more and 30 mm or less.

Therefore, in the fly-by wiring of which the effective branch wiring length is dispersed within a range from 5 mm to 30 mm, the ringing of waveform of the address/command signal is improved, and if becomes possible to satisfy the waveform definition.

Second Embodiment

Figure 10:
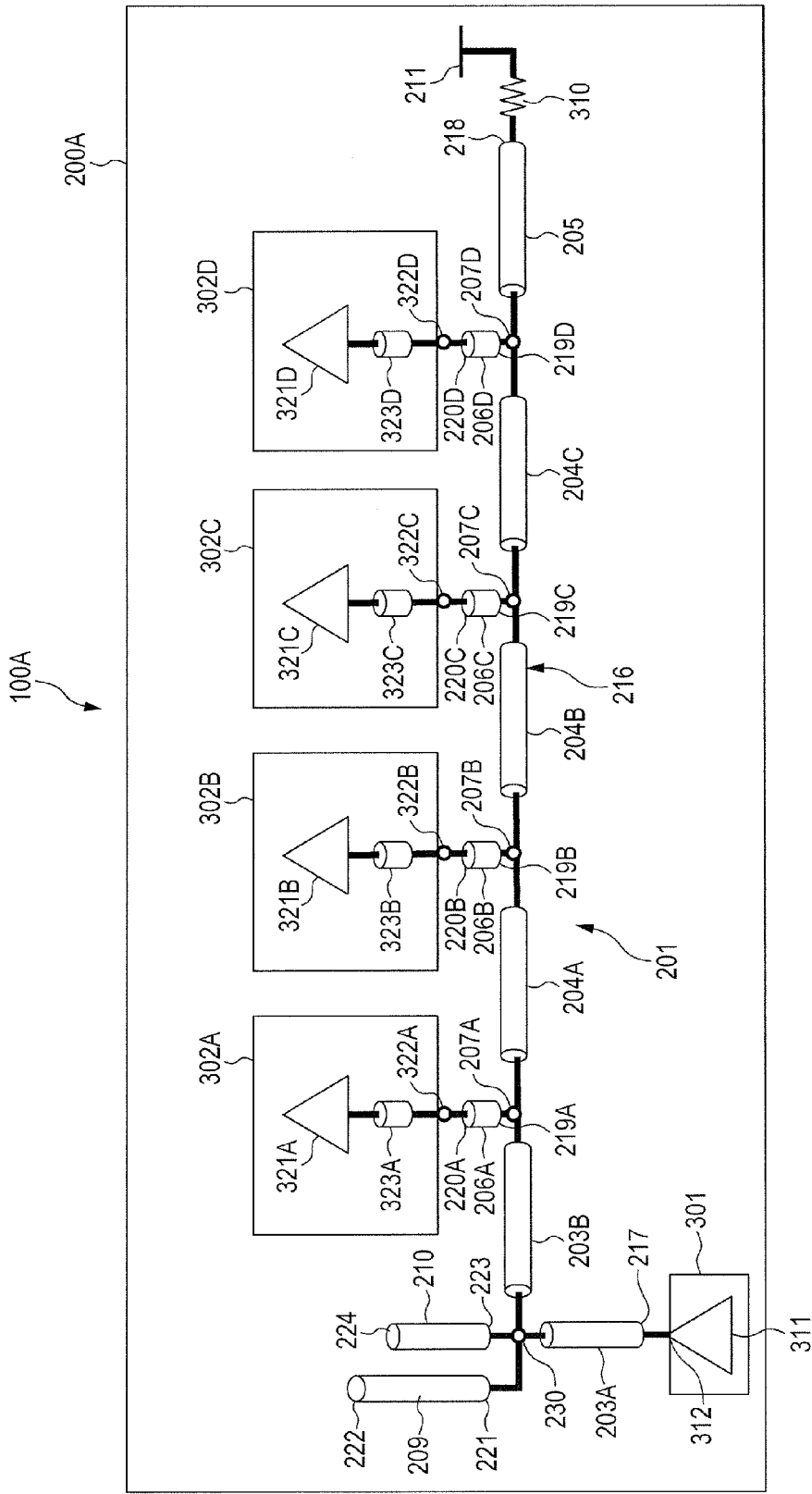
FIG. 10 is a topology diagram illustrating the wiring constitution of a memory system as an example of a printed circuit board according to a second embodiment of the present invention.

Next, a printed circuit board according to the second embodiment of the present invention will be described. FIG. 10 is a topology diagram illustrating the wiring constitution of a memory system as an example of a printed circuit board according to the second embodiment of the present invention. The same constitution as that of the above first embodiment is denoted by the same reference numeral or symbol and the description thereof will be omitted.

A memory system 100A, which is a printed circuit board, has a motherboard 200A serving as a printed wiring board, a memory controller 301 serving as a transmitting circuit and a plurality of memory devices 302A to 302D serving as a plurality of receiving circuits.

As described above, it was found that the negative factor of determining a waveform on the memory device 302A is the negative reflection from the branch point 207A of the main wiring 216 on the branch wiring 206A and the negative reflection from the post-stage branch point 207B on the main wiring 216.

Therefore, in the second embodiment, the motherboard 200A further has an open stub wiring 210 serving as a second open stub wiring for the wiring constitution of the above first embodiment.

The open stub wiring 210 is electrically connected to a connecting point 230 serving as a second connecting point on the main wiring between the start end 217 of the main wiring 216 and the branch point 207A serving as a first branch point.

That is, the open stub wiring 210 has a connecting end 223 serving as a second connecting end electrically connected to the connecting point 230 and an open end 224 serving as a second open end located at the opposite side to the connecting end 223.

In the second embodiment, the connecting point 230 also serves as a first connecting point to which the connecting end 221 of the open stub wiring 209 is electrically connected. That is, the open stub wiring 209 and the open stub wiring 210 are electrically connected to the common connecting point 230. Note that the open stub wiring 209 and the open stub wiring 210 may be connected to different connecting points if these points are on the main wiring between the start end 217 and the branch point 207A.

Figure 11C:
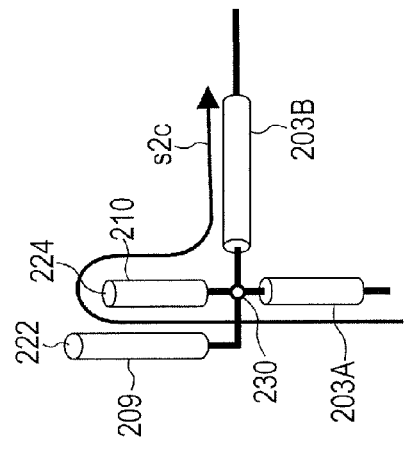
FIGS. 11A, 11B, 11C and 11D are diagrams for explaining signal waves obtained by adding the first open stub wiring and a second open stub wiring.
Figure 11B:
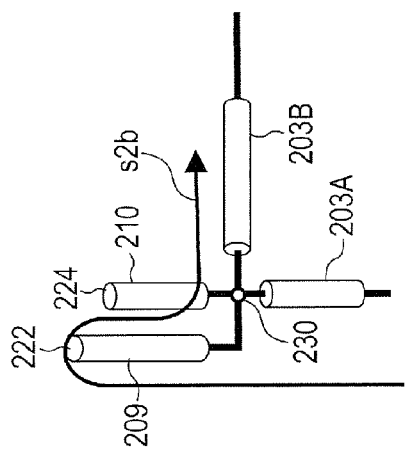
Figure 11A:
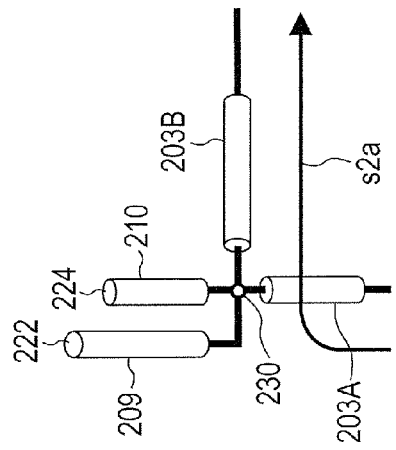
Figure 11D:
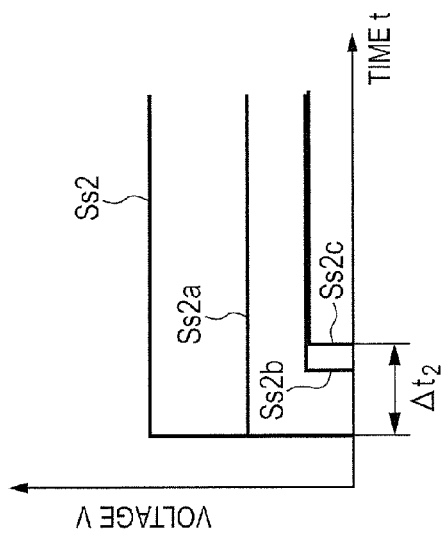

FIGS. 11A to 11D are diagrams for explaining signal waves obtained by adding the open stub wirings 209 and 210. FIG. 11A is the diagram for explaining a route s2a of a direct wave. FIG. 11B is the diagram for explaining a route s2b of a reflected wave, to be generated on the open stub wiring 209. FIG. 11C is the diagram for explaining a route s2c of a reflected wave to be generated on the open stub wiring 210. FIG. 11D is the waveform diagram of the respective signal waves which reach the memory device 302A. Here, a symbol Ss2 denotes a waveform in a case that the open stub wiring 209 does not exist.

A reflected wave Ss2b (this wave corresponds to the reflected wave Ss1b in the above first embodiment) due to the positive reflection is generated at the open end 222 of the open stub wiring 209 as described in the above first embodiment. Therefore, the length of the open stub wiring 209 is set to become such the wiring length defined in that the reflected wave Ssb2 due to the positive reflection is overlapped with the signal wave Sma-2a (FIG. 5D) due to the negative reflection on the memory device 302A (memory cell 321A), that is, the branch point 207A.

On the other hand, a reflected wave Ss2c due to the positive reflection is generated at the open end 224 of the open stub wiring 210. The length of the open stub wiring 210 is set to become such the wiring length defined in that the reflected wave Ss2c reflected at the open end 224 reaches the branch point 207A delayed by a transmission delay time $\Delta_{t2}$, which is a predetermined second transmission delay time, to a direct wave Ss2a (signal wave Sb0-2a in FIG. 4B). Note that the wiring length of the open stub wiring 210 is such a length from the connecting end 223 to the open end 224. This transmission delay time $\Delta_{t2}$ is a necessary delay time to reduce the signal wave Sb1-2a (FIG. 4B) on the memory device 302A (memory cell 321A), that is, the branch point 207A. Namely, it is a delay time defined in that the reflected wave Ss2c due to the positive reflection is overlapped with the signal wave Sb1-2a due to the negative reflection at the branch point 207A.

Accordingly, the signal wave Sb1-2a is attenuated by the reflected wave Ss2c to be converged at the branch point 207A, and the attenuated signal wave reaches the memory device 302A (memory cell 321A). If the voltage of the signal wave Sb1-2a is equal to the voltage of the reflected wave Ss2c, the voltage of the signal wave Sb1-2a which reaches the memory device 302A (memory cell 321A) becomes 0V due to the offset result. Incidentally, although it is preferable that the open stub wiring 210 is linearly formed, it may be crookedly formed.

In this manner, the positive signal wave Ss2b, which is delayed by a transmission delay time corresponding to a period of reciprocating one time on the open stub wiring 210, can be generated by the open stub wiring 209. Consequently, the signal wave Ss2b can be overlapped with the signal wave Sma-2a at the branch point 207A, and the main negative signal wave Sma-2a to be generated can be attenuated. Therefore, the ringing of a signal which reaches the memory device 302A (memory cell 321A) can be suppressed.

Further, in the second embodiment, the positive signal wave Ss2c, which is delayed by a transmission delay time corresponding to a period of reciprocating one time on the open stub wiring 210, can be generated by the open stub wiring 210. Consequently, the signal wave Ss2c can be overlapped with the signal wave Sb1-2a at the branch point 207A, and a main negative signal wave Sb1-2a to be generated can be attenuated. Therefore, the ringing of a signal which reaches the memory device 302A (memory cell 321A) can be more effectively suppressed.

In addition, since the size of a signal which is first transmitted to the branch point 207A becomes a small size by adding the open stub wiring 209, the size of a signal which branches at the branch point 207A also becomes a small size, and since the size of the signal waves Sma-2a and Sb1-2a also become a small size, there is also an effect of suppressing a magnitude of the ringing.

Example 2

FIGS. 12A to 12F are waveform diagrams indicating a result obtained by performing a simulation in the wiring constitution of an example 2. FIGS. 12A to 12F indicate a result obtained by performing a simulation in the wiring constitution illustrated in FIG. 10 under the following conditions.

The voltage of a signal (pulse), which the memory controller 301 transmits, was set to 1.5V, the internal characteristic impedance was set to 50Ω, the signal start-up time was set to 2V/ns and loads of the memory devices 302A to 302D were approximated to the load defined by 1 pF. The characteristic impedance of all the wirings was set to 50Ω and the delay time was set to 7 ns/m. The wiring length of the wiring 203A was set to 5 mm, the wiring length of the wiring 203B was set to 40 mm, the wiring length of the respective wildings 204A, 204B and 204C was set to 15 mm and the wiring length of the wiring 205 was set to 10 mm. The resistance value of the terminal end resistor 310 was set to 50Ω and the terminal end potential applied to the terminal end wiring 211 was set to 0.75V.

In addition, the total wiring length (effective branch wiring length) of the wiring length of the branch wirings 206A to 206D on the motherboard 200 and the effective wiring length of the inside the memory devices 302A to 302D was set under three kinds of conditions of 20 mm, 15 mm and 10 mm. FIG. 12A indicates a case that the effective branch wiring length is 20 mm, FIG. 12B indicates a case that the effective branch wiring length is 15 mm, and FIG. 12C indicates a case that the effective branch wiring length is 10 mm.

The wiring length of the open stub wiring 209 was set to 15 mm being equal to the wiring length of the wiring 204A between the branch point 207A and the branch point 207B, and the wiring length of the open stub wiring 210 was set to 20 mm supposing a case that the effective branch wiring length is in a state of the longest length.

In FIGS. 12A, 12B and 12C, the voltage of a signal to be received by the memory device 302A is assumed as $V_{21}$, the voltage of a signal to be received by the memory device 302B is assumed as $V_{22}$. And, the voltage of a signal to be received by the memory device 302C is assumed as $V_{23}$ and the voltage of a signal to be received by the memory device 302D is assumed as $V_{24}$.

As illustrated in FIGS. 12A, 12B and 12C, the waveform (voltage $V_{21}$) of a signal, which the memory cell 321A of the memory device 302A receives, does not drop below the threshold voltage $V_H$ under any conditions, and it can be confirmed that the ringing of the signal is improved. Incidentally, waveforms (voltage $V_{22}$ to $V_{24}$) of signals, which the memory cells 321B to 321D of the memory devices 302B to 302D receive, also do not drop below the threshold voltage $V_H$, and the quality of signals is secured.

FIG. 12D indicates a result obtained by comparing the Example 2 with a comparative example in a case that the effective branch wiring length is 20 mm, FIG. 12E indicates a result obtained by comparing the Example 2 with a comparative example in a case that the effective branch wiring length is 15 mm and FIG. 12F indicates a result obtained by comparing the Example 2 with a comparative example in a case that the effective branch wiring length is 10 mm. As illustrated in FIGS. 12D, 12E and 12F, it can be confirmed that waveforms of the signals, which the memory cell 321A of the memory device 302A receives, are improved under all the conditions.

Next, a result obtained by performing a simulation under the following conditions will be indicated in Table 2 in order to confirm an effective condition of the wiring length of the open stub wirings 209 and 210 in the wiring constitution illustrated in FIG. 10.

TABLE 2

Improvement amount (mV) in case of Example 2
(Minimum value in a case of the wiring lengths of the open stub wiring 209 = 5, 10, 15, 20, 25 and 30 mm)

| | | The wiring length (mm) or the wiring 204A | | | | |
|---|---|---|---|---|---|---|
| | | 10 | 15 | 20 | 25 | 30 |
| The wiring length (mm) of the open stub wiring 210 | 5 | 9 | 10 | 8 | 10 | 13 |
| | 10 | 14 | 15 | 15 | 19 | 17 |
| | 15 | 18 | 21 | 24 | 32 | 34 |
| | 20 | 30 | 30 | 28 | 34 | 34 |
| | 25 | 76 | 50 | 43 | 47 | 45 |
| | 30 | 54 | 79 | 58 | 58 | 54 |
| | 35 | −71 | −77 | −82 | 29 | 37 |
| | 40 | −95 | −83 | −87 | −81 | −79 |

The voltage of a signal (pulse), which the memory controller 301 transmits, was set to 1.5V, the internal characteristic impedance was set to 50Ω, the signal start-up time was set to 2V/ns and the load capacity of the memory devices 302A to 302D was set to 0 pF. The characteristic impedance of all the wirings was set to 50Ω and the delay time was set to 7 ns/m. The wiring length of the wiring 203A was set to 5 mm, the wiring length of the wiring 203B was set to 100 mm and the wiring length of the wiring 205 was set to 10 mm. The resistance value of the terminal end resistor 310 was set to 50Ω and the terminal end potential applied to the terminal end wiring 211 was set to 0.75V. The inspection was performed by changing the conditions by a manner that the wiring length of the respective wirings 204A, 204B and 204C was changed to become 10 mm, 15 mm, 20 mm, 25 mm and 30 mm.

In addition, as for the wiring length of the open stub wirings 209 and 210, a simulation was performed under six kinds of conditions of 5 mm, 10 mm, 15 mm, 20 mm, 25 mm and 30 mm. Specifically, the simulation, was performed under six kinds of conditions, where the length of the open stub wiring 209 was set to become 5 mm, 10 mm, 15 mm, 20 mm, 25 mm and 30 mm to the one length condition of the open stub wiring 210.

Table 2 indicates a result of obtained the improvement amount from a case that the open stub wirings 209 and 210 do not exist for such a result, where the degree of ringing becomes the largest in a process of changing the length of the open stub wiring 209, to the one length condition of the open stub wiring 210. Incidentally, the result indicated in Table 2 becomes such a result, where positive numbers indicate that a waveform is improved and negative numbers indicate that a waveform is not improved. The result obtained by changing the wiring length of the open stub wirings 209 and 210 is indicated within a range of dispersion (10 mm to 30 mm) of the wiring length of the wirings 204A, 204B and 204C and a range of dispersion (5 mm to 30 mm) of the effective branch wiring length to be considered.

From the result in Table 2, it was confirmed that the ringing of the waveform was improved in all the combinations of the wiring lengths, where the wiring length of the open stub wirings 209 and 210 was set to 5 mm or more and 30 mm or less.

Therefore, in the fly-by wiring of which the effective branch wiring length is dispersed within a range from 5 mm to 30 mm, the ringing of the waveform, of the address/command signal is considerably improved, and it becomes possible to satisfy the waveform definition.

Third Embodiment

Figure 13:
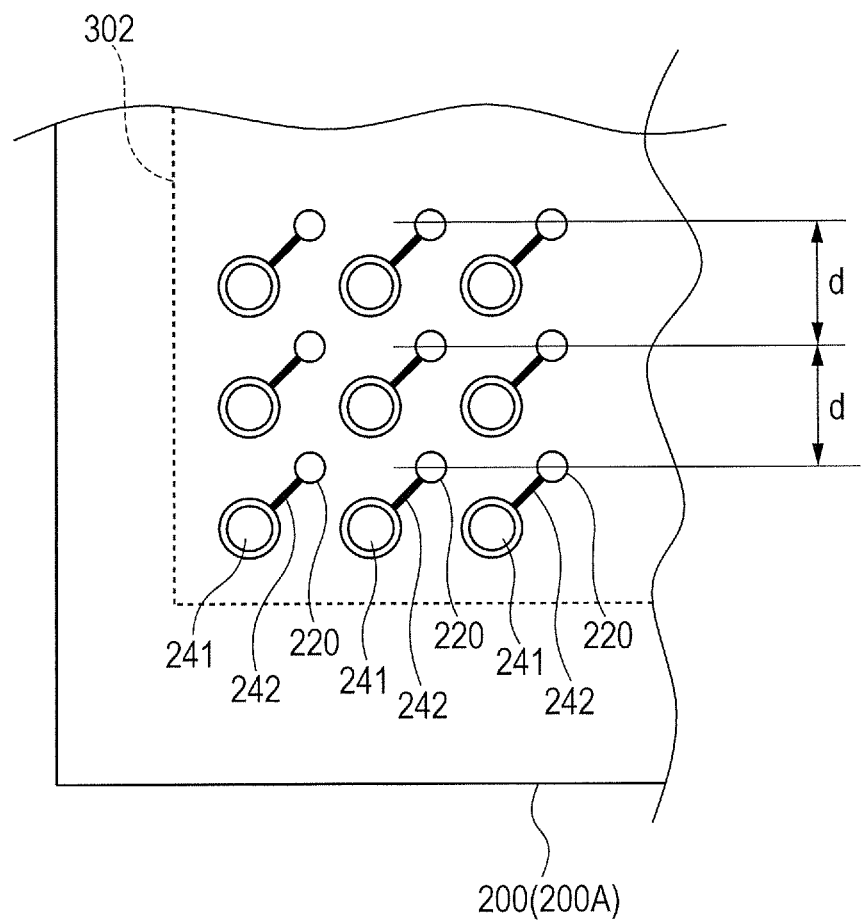
FIG. 13 is a plan view of a motherboard, which indicates an area close to a portion, on which memory devices are to be mounted, as an example of a printed wiring board according to a third embodiment of the present invention.

Next, a printed circuit, board according to a third embodiment of the present, invention will be described. FIG. 13 is a plan view of a motherboard, which indicates an area close to a portion, on which memory devices are to be mounted, as an example of a printed wiring board according to the third embodiment of the present invention. The same constitutions as those of the above first and second embodiments are denoted by the same reference numeral or symbol.

A motherboard 200 (200A), on which the memory device 302 which is a BGA (Ball Grid Array) semiconductor package is mounted, has mounting pads 220 disposed in array. A distance d between the mounting pads 220 becomes a pitch of 0.8 mm in the DDR3-SDRAM typed memory device 302. And, the mounting pads 220 and via holes 241 of which the diameters are less than those of the above first embodiment are prepared, and the via hole 241 is disposed between the mounting pads 220 having a pitch of 0.8 mm as the distance between the pads. Even if this constitution is adopted, an effect of suppressing the ringing is exhibited similar to cases of the above first and second embodiments.

Incidentally, the present invention is not limited to the above embodiments, but many variations can be adopted by persons skilled in art in this field within the scope of technical ideas according to the present invention.

In the above first to third embodiments, although it has been described about a case that a printed circuit board is a memory system and a printed wiring board is a motherboard on which memory devices and a memory controller are mounted, it is not limited to this case. The printed circuit board may be a memory module (DIMM) constituted by a module substrate serving as a printed wiring board and memory devices mounted on the module substrate. In this case, the memory controller is mounted on the motherboard, and the memory controller is electrically connected to the memory devices by connecting the memory module with the motherboard by using a connector or the like.

The present invention can be applied to a system, where signals are transmitted and received between a transmitting circuit and a receiving circuit, other than a memory system or a memory module.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-025454, filed Feb. 13, 2013, which is hereby incorporated by reference herein in its entirety.

What is claimed is:

1. A printed circuit board comprising:
    a printed wiring board; and
    a first receiving circuit and a second receiving circuit, which are respectively mounted on the printed wiring board, and each of which is configured to receive a signal transmitted from a transmitting circuit through the printed wiring board,
    wherein the printed wiring board includes at least
    a main wiring of which a start end is electrically connected to the transmitting circuit,
    a first branch wiring of which one end is electrically connected to a first branch point on the main wiring and of which the other end is electrically connected to the first receiving circuit,
    a second branch wiring of which one end is electrically connected to a second branch point on the main wiring farther from the start end than the first branch point, and of which the other end is electrically connected to the second receiving circuit, and
    a first open stub wiring which includes a first connecting end electrically connected to a first connecting point on the main wiring between the start end and the first branch point, and a first open end opposite to the first connecting end.

2. The printed circuit board according to claim 1, wherein the first open stub wiring has a wiring length of 5 mm or more and 30 mm or less.

3. The printed circuit board according to claim 1, wherein a wiring length of the first open stub wiring is substantially equal to a wiring length between the first branch point and the second branch point on the main wiring.

4. The printed circuit board according to claim 1, wherein the transmitting circuit is mounted on the printed wiring board, each of the first receiving circuit and the second receiving circuit includes a memory device, and the transmitting circuit includes a memory controller for controlling the memory device.

5. A printed circuit board comprising:
    a printed wiring board; and
    a first receiving circuit and a second receiving circuit, which are respectively mounted on the printed wiring board, and each of which is configured to receive a signal transmitted from a transmitting circuit through the printed wiring board,
    wherein the printed wiring board includes at least
    a main wiring of which a start end is electrically connected to the transmitting circuit,
    a first branch wiring of which one end is electrically connected to a first branch point on the main wiring and of which the other end is electrically connected to the first receiving circuit,
    a second branch wiring of which one end is electrically connected to a second branch point on the main wiring farther from the start end than the first branch point, and of which the other end is electrically connected to the second receiving circuit,
    a first open stub wiring which includes a first connecting end electrically connected to a first connecting point on the main wiring between the start end and the first branch point, and a first open end opposite to the first connecting end, and
    a second open stub wiring which includes a second connecting end electrically connected to a second connecting point on the main wiring between the start end and the first branch point, and a second open end opposite to the second connecting end.

6. The printed circuit board according to claim 5, wherein the first open stub wiring has a wiring length of 5 mm or more and 30 mm or less, and the second open stub wiring has a wiring length of 5 mm or more and 30 mm or less.

7. The printed circuit board according to claim 5, wherein a wiring length of the second open stub wiring is substantially equal to a wiring length of the first branch wiring.

8. The printed circuit board according to claim 5, wherein the transmitting circuit is mounted on the printed wiring board, each of the first receiving circuit and the second receiving circuit includes a memory device, and the transmitting circuit includes a memory controller for controlling the memory device.

9. A printed wiring board on which, among a transmitting circuit, a first receiving circuit and a second receiving circuit, at least the first receiving circuit and the second receiving circuit are to be mounted, comprising:
 a first receiving terminal including the first receiving circuit to be mounted and a second receiving terminal including the second receiving circuit to be mounted, which are respectively displayed on the printed wiring board, and each of which is configured to receive a signal transmitted from the transmitting circuit through the printed wiring board,
 wherein the printed wiring board includes at least
 a main wiring of which a start end is electrically connected to the transmitting circuit,
 a first branch wiring of which one end is electrically connected to a first branch point on the main wiring and of which the other end is electrically connected to the first receiving circuit,
 a second branch wiring of which one end is electrically connected to a second branch point on the main wiring farther from the start end than the first branch point, and of which the other end is electrically connected to the second receiving circuit, and
 a first open stub wiring which includes a first connecting end electrically connected to a first connecting point on the main wiring between the start end and the first branch point, and a first open end opposite to the first connecting end.

10. The printed wiring board according to claim 9, wherein the first open stub wiring has a wiring length of 5 mm or more and 30 mm or less.

11. A printed wiring board on which, among a transmitting circuit, a first receiving circuit and a second receiving circuit, at least the first receiving circuit and the second receiving circuit are to be mounted, comprising:
 a first receiving terminal including the first receiving circuit to be mounted and a second receiving terminal including the second receiving circuit to be mounted, which are respectively displaced on the printed wiring board, and each of which is configured to receive a signal transmitted from the transmitting circuit through the printed wiring board,
 wherein the printed wiring board includes at least
 a main wiring of which a start end is electrically connected to the transmitting circuit,
 a first branch wiring of which one end is electrically connected to a first branch point on the main wiring and of which the other end is electrically connected to the first receiving circuit,
 a second branch wiring of which one end is electrically connected to a second branch point on the main wiring farther from the start end than the first branch point, and of which the other end is electrically connected to the second receiving circuit,
 a first open stub wiring which includes a first connecting end electrically connected to a first connecting point on the main wiring between the start end and the first branch point, and a first open end opposite to the first connecting end, and
 a second open stub wiring which includes a second connecting end electrically connected to a second connecting point on the main wiring between the start end and the first branch point, and a second open end opposite to the second connecting end.

12. The printed wiring board according to claim 11, wherein the first open stub wiring has a wiring length of 5 mm or more and 30 mm or less, and the second open stub wiring has a wiring length of 5 mm or more and 30 mm or less.

\* \* \* \* \*